US010284400B2

(12) United States Patent
Tanio et al.

(10) Patent No.: US 10,284,400 B2
(45) Date of Patent: May 7, 2019

(54) DELTA-SIGMA MODULATOR, TRANSMITTER, AND INTEGRATOR

(71) Applicant: NEC Corporation, Minato-ku, Tokyo (JP)

(72) Inventors: Masaaki Tanio, Tokyo (JP); Tomoyuki Yamase, Tokyo (JP); Shinichi Hori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/755,191

(22) PCT Filed: Sep. 1, 2015

(86) PCT No.: PCT/JP2015/074893
§ 371 (c)(1),
(2) Date: Feb. 26, 2018

(87) PCT Pub. No.: WO2017/037880
PCT Pub. Date: Mar. 9, 2017

(65) Prior Publication Data
US 2018/0248724 A1 Aug. 30, 2018

(51) Int. Cl.
*H03M 3/00* (2006.01)
*H04L 27/12* (2006.01)
(Continued)

(52) U.S. Cl.
CPC .............. *H04L 27/12* (2013.01); *G06F 7/544* (2013.01); *H03M 3/39* (2013.01); *H03M 3/50* (2013.01);
(Continued)

(58) Field of Classification Search
USPC .................................................. 375/242–254
See application file for complete search history.

(56) References Cited

U.S. PATENT DOCUMENTS

| 4,208,740 A * | 6/1980 | Yin | H04J 3/04 341/143 |
| 4,450,561 A * | 5/1984 | Gotze | H03M 13/19 714/757 |

(Continued)

FOREIGN PATENT DOCUMENTS

| JP | H06-318149 A | 11/1994 |
| JP | 2004048703 A | 2/2004 |
| JP | 2013-500662 A | 1/2013 |

OTHER PUBLICATIONS

Ameya Bhide et al., "An 8-GS/s 200-MHz Bandwidth 68-mW ΔΣ DAC in 65-nm CMOS", IEEE Transactions on Circuits and Systems—II: Express Briefs, Jul. 2013, pp. 387-391, vol. 60, No. 7, cited in the Specification and ISR.

(Continued)

Primary Examiner — James M Perez

(57) ABSTRACT

This ΔΣ modulator is a ΔΣ modulator using multiple integrators. The integrator: includes a plurality of stages of adder sequences, each of the adder sequences including a plurality of adders connected in series; performs feedback of a result of a second adder sequence as an input to a first adder sequence, the first adder sequence being a first stage of the plurality of stages, and the second adder sequence being a last stage of the plurality of stages; and processes inputs supplied to the plurality of adders of the first adder sequence and supplies it to the second adder sequence.

12 Claims, 17 Drawing Sheets

(51) Int. Cl.
    *G06F 7/544*     (2006.01)
    *H04B 1/04*     (2006.01)
    *H03M 7/32*     (2006.01)
    *H03K 19/21*     (2006.01)

(52) U.S. Cl.
    CPC ............ *H03M 7/3017* (2013.01); *H04B 1/04* (2013.01); *H03K 19/21* (2013.01); *H04B 2001/0408* (2013.01)

(56) References Cited

U.S. PATENT DOCUMENTS

| | | | | |
|---|---|---|---|---|
| 4,636,856 A * | 1/1987 | Starck | G06F 7/49 | 375/240.12 |
| 4,937,577 A * | 6/1990 | Rich | G06F 7/5095 | 341/143 |
| 4,958,158 A * | 9/1990 | Hashizume | H03M 3/02 | 341/143 |
| 5,157,395 A * | 10/1992 | Del Signore | H03H 17/0294 | 341/143 |
| 5,222,084 A * | 6/1993 | Takahashi | H04B 3/23 | 370/290 |
| 5,301,134 A * | 4/1994 | Maruyama | H03H 17/0223 | 708/313 |
| 5,313,469 A * | 5/1994 | Adham | G01R 31/31832 | 708/444 |
| 5,345,233 A * | 9/1994 | Nagata | H03M 7/3015 | 341/76 |
| 5,347,279 A * | 9/1994 | Ishihara | H03M 3/356 | 341/143 |
| 5,426,598 A * | 6/1995 | Hagihara | G06F 7/509 | 708/627 |
| 5,455,783 A * | 10/1995 | Yukawa | H03H 17/0664 | 708/313 |
| 5,485,415 A * | 1/1996 | Kiji | G06F 7/5095 | 708/444 |
| 5,801,652 A * | 9/1998 | Gong | G06F 17/18 | 341/118 |
| 5,818,375 A * | 10/1998 | Yoshizawa | H03M 7/302 | 341/143 |
| 5,920,273 A * | 7/1999 | Hirano | H03M 3/384 | 341/118 |
| 6,041,339 A * | 3/2000 | Yu | H03H 17/0664 | 708/313 |
| 6,304,133 B1 * | 10/2001 | Sato | H03H 17/026 | 327/551 |
| 6,404,368 B1 * | 6/2002 | Yamaguchi | H03M 3/412 | 341/143 |
| 6,581,082 B1 * | 6/2003 | Opsahl | H03L 7/1976 | 708/443 |
| 6,603,812 B1 * | 8/2003 | Oprescu | H03H 17/0664 | 375/232 |
| 6,765,520 B1 * | 7/2004 | Chuang | H03M 3/364 | 341/143 |
| 8,116,203 B2 * | 2/2012 | Kadambi | H04L 12/4641 | 370/235 |
| 8,468,431 B2 * | 6/2013 | Steiner | H03M 13/09 | 714/780 |
| 8,830,097 B2 * | 9/2014 | Aruga | H03M 3/35 | 341/122 |
| 2004/0036530 A1 * | 2/2004 | Matsuura | H03F 1/0222 | 330/10 |
| 2008/0238743 A1 * | 10/2008 | Koyama | H03M 3/328 | 341/131 |
| 2010/0164774 A1 * | 7/2010 | Madoglio | H03M 7/3004 | 341/143 |
| 2010/0176847 A1 * | 7/2010 | Kitsunezuka | H03G 1/0088 | 327/103 |
| 2012/0030269 A1 * | 2/2012 | Rubio | H03H 17/025 | 708/270 |
| 2012/0281784 A1 * | 11/2012 | Beydoun | H03M 1/1028 | 375/295 |
| 2012/0313722 A1 * | 12/2012 | Morand | H03L 7/085 | 332/109 |
| 2013/0016795 A1 * | 1/2013 | Kunihiro | H03F 1/0288 | 375/295 |
| 2013/0177062 A1 * | 7/2013 | Hori | H03M 3/392 | 375/227 |
| 2013/0194037 A1 * | 8/2013 | Takahashi | H03F 1/32 | 330/3 |
| 2015/0263768 A1 * | 9/2015 | Hori | H03F 3/2173 | 375/297 |
| 2015/0311914 A1 * | 10/2015 | Chae | H03M 3/484 | 250/208.1 |
| 2017/0222627 A1 * | 8/2017 | Kajita | H03H 17/02 | |

OTHER PUBLICATIONS

Rui F. Cordeiro et al., "Gigasample Time-Interleaved Delta-Sigma Modulator for FPGA-based All-Digital Transmitters", 2014 17th Euromicro Conference on Digital System Design (DSD), Aug. 2014, pp. 222-227, cited in ISR.

Masaaki Tanio et al., "A Linear and Efficient 1-bit Digital Transmitter with Envelope Delta-sigma Modulation", IEICE Technical Report, Jan. 8, 2015, pp. 89-94, vol. 114, No. 392, cited in ISR.

International Search Report for PCT Application No. PCT/JP2015/074893, dated Nov. 2, 2015.

\* cited by examiner

DELTA-SIGMA MODULATOR, TRANSMITTER, AND INTEGRATOR

This application is a National Stage Entry of PCT/JP2015/074893 filed on Sep. 1, 2015, the contents of all of which are incorporated herein by reference, in their entirety.

TECHNICAL FIELD

The present invention relates to a ΔΣ modulator, a transmitter, and an integrator.

BACKGROUND ART

In wireless communication, the effective use of various frequency bands is required, and accordingly, wireless devices supporting various frequencies are being demanded. With regard to transmitters, one-bit digital transmitters in which an analog circuit capable of supporting a fixed frequency is replaced with a digital circuit which does not depend on frequency, are being studied.

Patent Document 1 describes, as a related technique, a technique relating to a ΔΣ DAC (Digital-to-Analog Converter) used when performing wireless communication.

PRIOR ART DOCUMENTS

Non-Patent Document

[Non-Patent Document 1] Ameya Bhide, Omid Esmailzadeh Najari, Behzad Mesgarzadeh, and Atila Alvandpour, "An 8-GS/s 200-MHz Bandwidth 68-mW ΔΣ DAC in 65-nm CMOS," IEEE TRANSACTIONS ON CIRCUITS AND SYSTEMS-II: EXPRESS BRIEFS, vol. 60, no. 7, pp. 387-391, JULY 2013.

SUMMARY OF INVENTION

Problem to be Solved by the Invention

Incidentally, in recent years, the carrier frequency in wireless communication has shifted to a high frequency band, and demand for high-speed operation (high-bit rate) ΔΣ modulation is increasing.

However, the operating frequency of ΔΣ modulators is, for example, a maximum of twice the carrier frequency in the case of low-pass ΔΣ modulation, and equal to the carrier frequency in the case of envelope ΔΣ modulation, and is generally proportional to the carrier frequency irrespective of the ΔΣ modulation method.

Therefore, proposed is a ΔΣ modulator 2 shown in FIG. 16 that uses an integrator (described as a TI (Time Interleave) accumulator in FIG. 16).

The ΔΣ modulator 2 includes TI accumulators 100 (100a1, 100a2, 100a3, ... ) corresponding in number to the bit precision of the input signal. For example, when the input signal has a 16-bit precision, the ΔΣ modulator 2 using TI accumulators includes 16 TI accumulators 100a1 to 100a16, which is equal in number to the bit precision of the input signal. In the ΔΣ modulator 2, the TI accumulator 100a16 performs processing of the most significant bit of an input signal. The TI accumulator 100a15 performs processing of a bit one order lower in an input signal than the TI accumulator 100a16. The TI accumulators performs processing of a bit one order lower in an input signal each time the number following the reference symbol 100a decreases by one. Therefore, the TI accumulator 100a1 processes the least significant bit of an input signal. The TI accumulators 100a1 to 100a16 respectively operate at an operating frequency M and input N bits of a digit-divided input signal (described in detail below) and N bits representing a processing result of a lower order TI accumulator than the TI accumulator itself to perform N-fold parallel processing. In this manner, the ΔΣ modulator 2 using the TI accumulators 100 has the operating frequency M while setting the number of parallel processes to N.

In the ΔΣ modulator 2 using the TI accumulators 100, a serializer performs parallel-serial conversion of an N-bit output of the most significant bit 100a16 having the operating frequency M, and outputs it by bundling it into a one-bit sequence having a bit rate of M×N. The ΔΣ modulator 2 ultimately realizes a bit rate of M×N, which is equivalent to a ΔΣ modulator with an operating frequency of M×N.

As shown in FIG. 17, the TI accumulator 100 included in the ΔΣ modulator 2 includes serially connected full adders (hereunder referred to as "FA") 300 (300a1, 300a2, ... ) that are equal in number to the number of parallel processes N. The calculation time for a calculation performed by a single FA depends on the device characteristics (mainly the frequency characteristics) of the device constituting the FA. Consequently, in the TI accumulator 100, when the device constituting the FA is determined, then at that time the maximum operating frequency M corresponding to the device characteristics is determined. Furthermore, in the TI accumulator 100, N-fold parallel processing is not correctly performed unless it is completed within a time represented by the reciprocal of the maximum operating frequency M. Consequently, when the maximum operating frequency M is determined, the number of parallel processes N and the number of FAs N are determined. In this case, the time represented by the reciprocal of the maximum operating frequency M becomes shorter as the maximum operating frequency M increases. Therefore, the maximum operating frequency M and the number of parallel processes N are in a trade-off relationship. As a result of this trade-off relationship, in the TI accumulator 100, even if the FA is configured using a device capable of high-speed operation and the maximum operating frequency M is increased, the number of parallel processes N correspondingly decreases, and the maximum bit rate becomes limited.

Therefore, high-speed operation of the ΔΣ modulator 2 is limited by the trade-off relationship between the maximum operating frequency M and the number of parallel processes N even when the TI accumulator 100 is used. Therefore, high-speed operation of the ΔΣ modulator 2 is generally difficult.

The present invention provides a ΔΣ modulator capable of high-speed ΔΣ modulation in a transmitter.

Means for Solving the Problem

According to a first exemplary aspect of the present invention, a ΔΣ modulator is a ΔΣ modulator using multiple integrators. The integrator: includes a plurality of stages of adder sequences, each of the adder sequences including a plurality of adders connected in series; performs feedback of a result of a second adder sequence as an input to a first adder sequence, the first adder sequence being a first stage of the plurality of stages, and the second adder sequence being a last stage of the plurality of stages; and processes inputs supplied to the plurality of adders of the first adder sequence and supplies it to the second adder sequence.

According to a second exemplary aspect of the present invention, a transmitter includes the ΔΣ modulator mentioned above.

According to a third exemplary aspect of the present invention, an integrator: includes a plurality of stages of adder sequences, each of the adder sequences including a plurality of adders connected in series; performs feedback of a result of a second adder sequence as an input to a first adder sequence, the first adder sequence being a first stage of the plurality of stages, and the second adder sequence being a last stage of the plurality of stages; and processes inputs supplied to the plurality of adders of the first adder sequence and supplies it to the second adder sequence.

Effect of the Invention

According to the ΔΣ modulator described above, high-speed ΔΣ modulation can be performed in a transmitter.

EMBODIMENTS FOR CARRYING OUT THE INVENTION

Hereunder, exemplary embodiments will be described with reference to the drawings.

First Exemplary Embodiment

A transmitter including a ΔΣ modulator according to a first exemplary embodiment of the present invention will be described.

Figure 1:
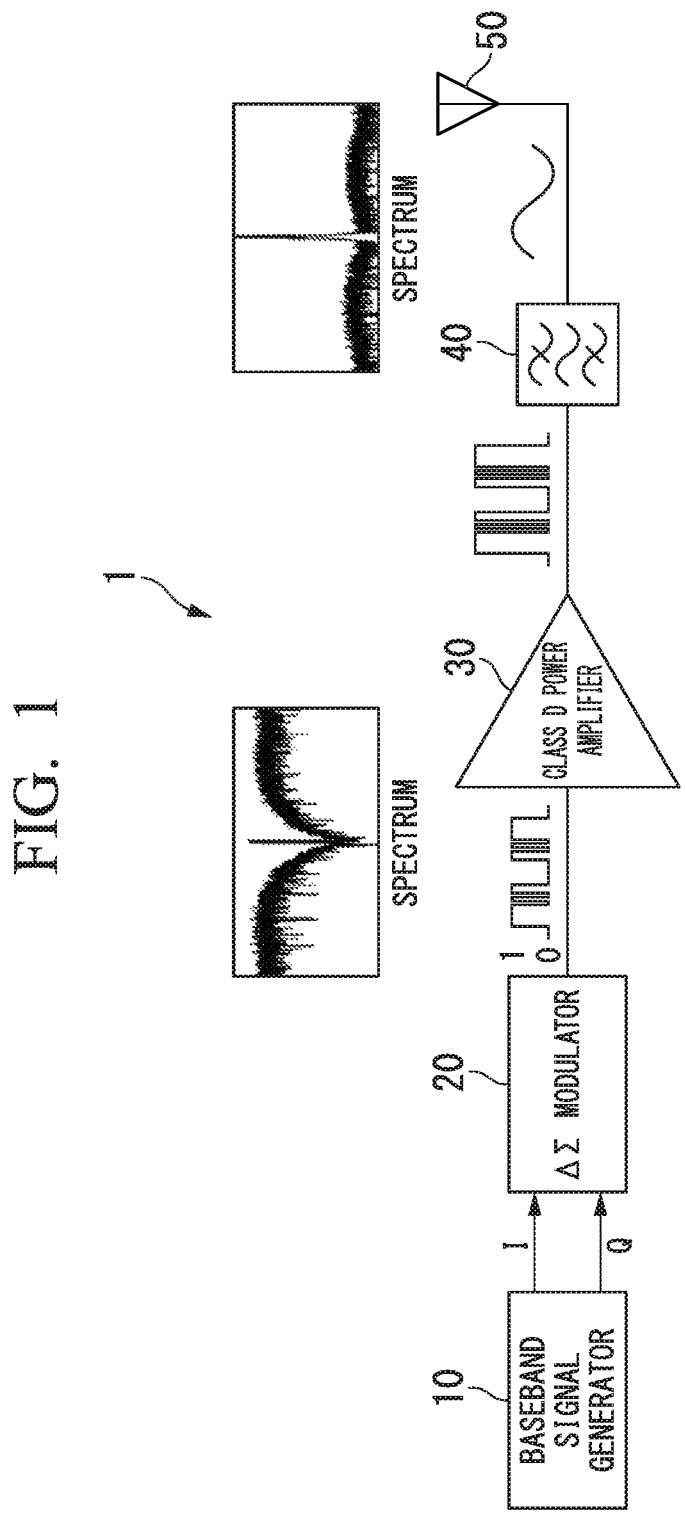
FIG. 1 is a diagram showing a configuration of a digital transmitter according to a first exemplary embodiment of the present invention.

As shown in FIG. 1, a transmitter 1 according to the present exemplary embodiment includes a baseband signal generator 10, a ΔΣ modulator 20, a class D power amplifier 30, a band pass filter 40, and an antenna 50.

The output of the baseband signal generator 10 is connected to the input of the ΔΣ modulator 20. The output of the ΔΣ modulator 20 is connected to the input of the class D power amplifier 30. The output of the class D power amplifier 30 is connected to the input of the band pass filter 40. The output of the band pass filter 40 is connected to the antenna 50.

The baseband signal generator 10 generates a baseband I signal and a Q signal that is 90 degrees out-of-phase with the I signal. The baseband signal generator 10 transmits the generated I signal and Q signal to the ΔΣ modulator 20.

The ΔΣ modulator 20 receives the I signal and the Q signal from the baseband signal generator 10. The ΔΣ modulator 20 subjects the received I signal and Q signal to ΔΣ modulation, and converts them into a binary pulse train. The ΔΣ modulator 20 transmits the converted binary pulse train to the class D power amplifier 30.

The class D power amplifier 30 receives the binary pulse train from the ΔΣ modulator 20. The class D power amplifier 30 amplifies the received binary pulse train while retaining the pulse train pattern. The class D power amplifier 30 transmits the amplified binary pulse train to the band pass filter 40.

The binary pulse train transmitted from the class D power amplifier 30 is passed through the band pass filter 40. The band pass filter 40 removes low-frequency components and high-frequency components included in the binary pulse train outside of the desired band (which is near the carrier frequency fc), and generates an RF signal having the amplified carrier frequency fc. The RF signal having the carrier frequency fc generated by the band pass filter 40 is transmitted from the band pass filter 40 to the antenna 50.

The antenna 50 transmits the RF signal having the carrier frequency fc transmitted from the band pass filter 40 to the exterior of the transmitter 1.

The ΔΣ modulator 20 according to the present exemplary embodiment will be described.

Figure 2:
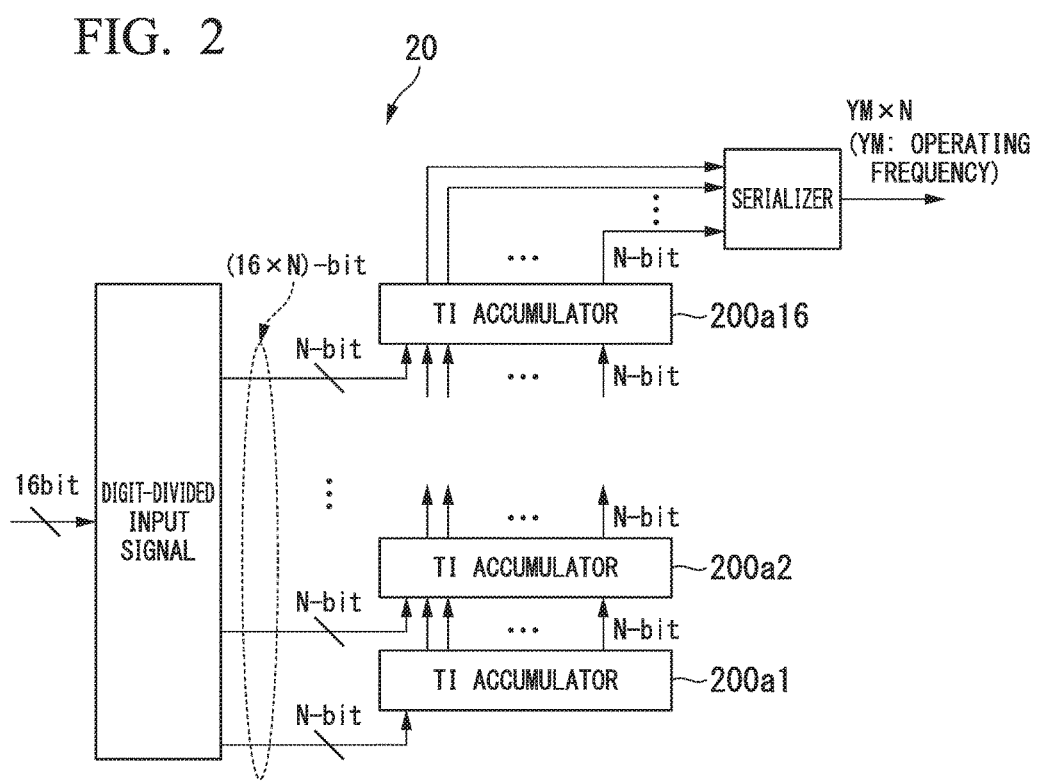
FIG. 2 is a diagram showing a configuration of a ΔΣ modulator according to the present exemplary embodiment.
Figure 16:
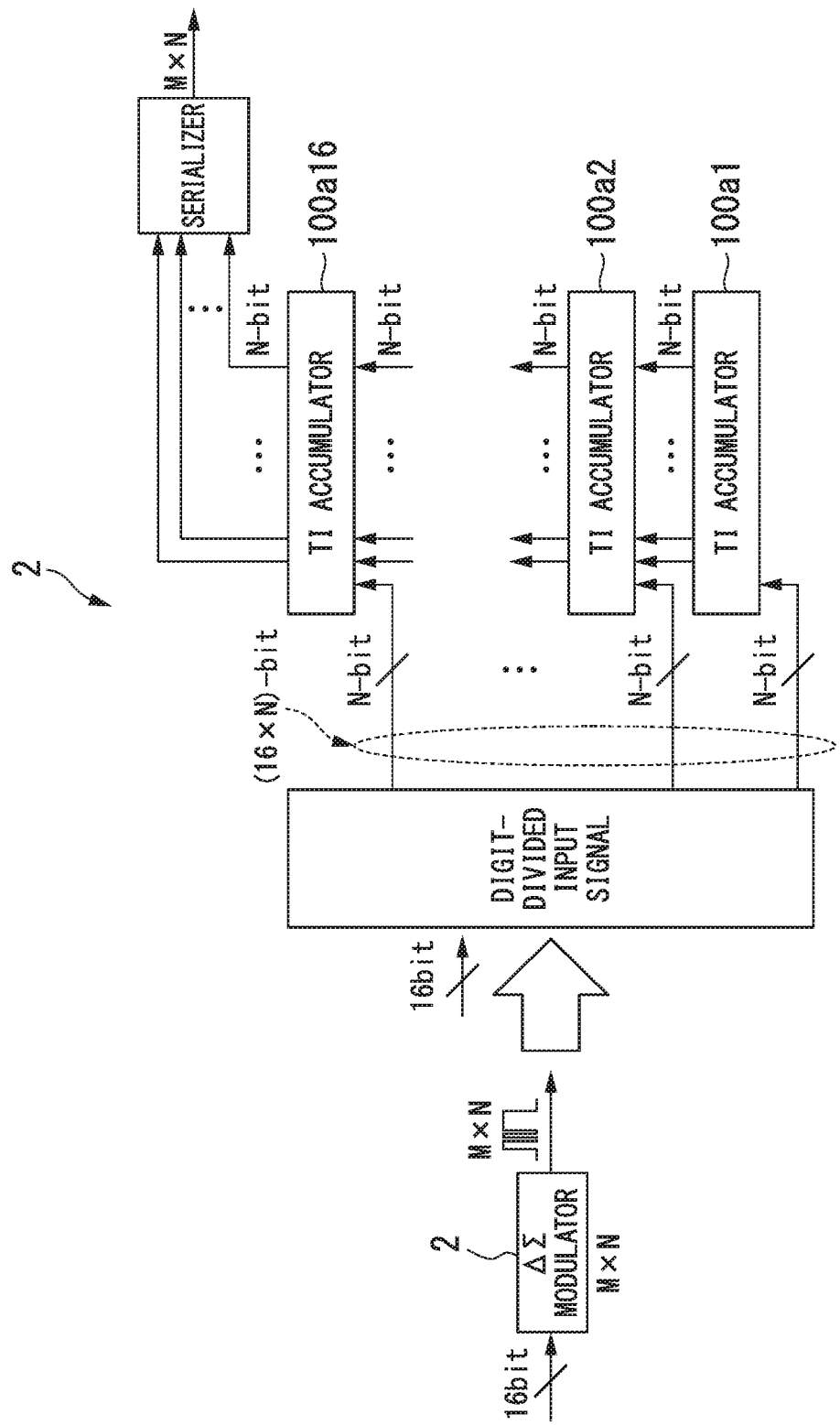
FIG. 16 is a diagram showing a configuration of a related ΔΣ modulator.

As shown in FIG. 2, the ΔΣ modulator 20 according to the present exemplary embodiment includes the same number of TI accumulators (integrators) 200 (200a1, 200a2, 200a3, . . . ) as the bit precision of the input signal. The ΔΣ modulator 20 shown in FIG. 2 represents an example of a case where the bit precision of the input signal is 16 bits. The ΔΣ modulator 20 shown in FIG. 2 is a ΔΣ modulator in which each of the TI accumulators 100a1 to 100a16 in the ΔΣ modulator 2 shown in FIG. 16 have respectively been replaced with the TI accumulators 200a1 to 200a16.

The digit-divided input signal generated by the ΔΣ modulator 20 that is input to the TI accumulators 200*a*1 to 200*a*16 will be described.

The digit-divided input signal according to the present exemplary embodiment is an offset binary representing an unsigned signal. It is a signal in which the most significant bit corresponds to the largest value. The bit rate of the digit-divided input signal needs to be adjusted to M×N, which is the operating frequency of the ΔΣ modulator 20.

In a case where an input signal to the ΔΣ modulator 20 has the bit rate M, the digit-divided input signal is generated by the following two methods for example.

Figure 3:
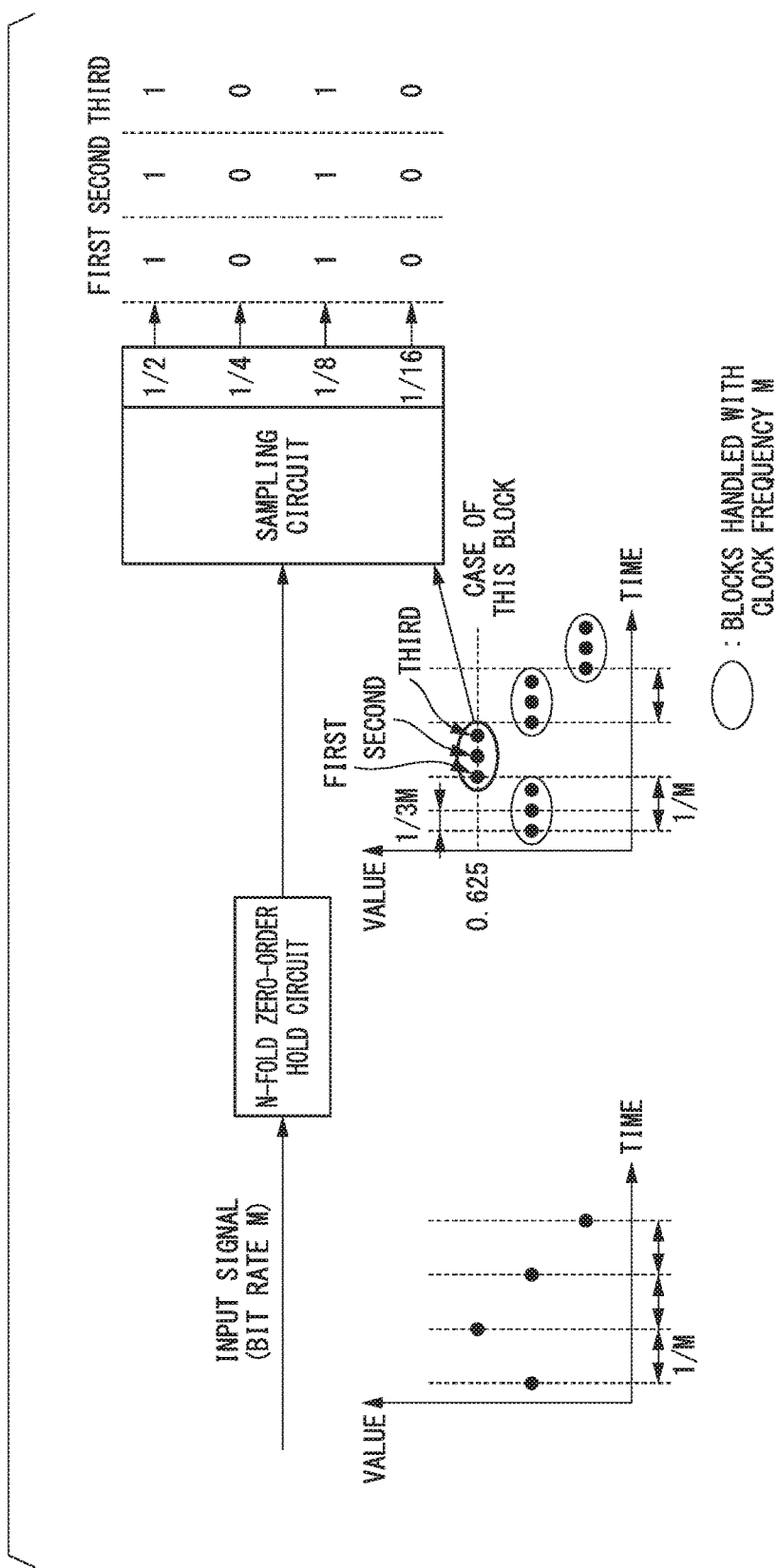
FIG. 3 is a first diagram for describing a digit-divided input signal according to the present exemplary embodiment.
Figure 4:
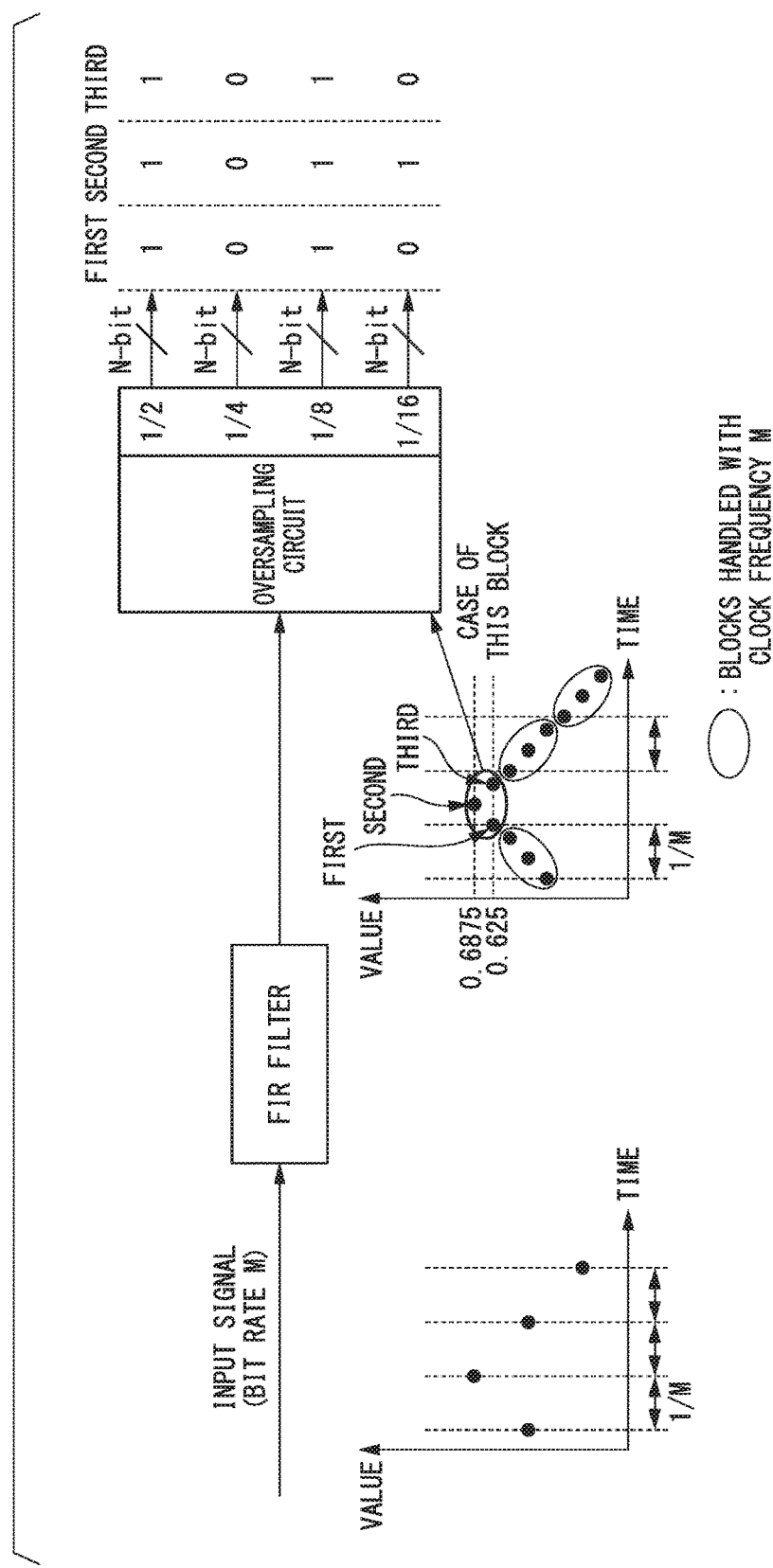
FIG. 4 is a second diagram for describing a digit-divided input signal according to the present exemplary embodiment.

To simplify the description, the digit-divided input signal is described referring to FIGS. 3 and 4 as one in which the input signal to the ΔΣ modulator 20 has a bit accuracy of 4 bits (16 bits in FIG. 2), the input signal to the ΔΣ modulator 20 has a bit rate M (which can ultimately be made Y-fold larger to give an operating frequency YM as shown in FIG. 2 by the effect of the ΔΣ modulator 20 according to the exemplary embodiment of the present invention), and a number of parallel processes N of 3.

A first method of generating the digit-divided input signal is one that performs M×N oversampling, wherein an N-fold zero-order hold is performed with respect to an input signal to the ΔΣ modulator 20 having a bit rate of M. Specifically, the first method is one that generates a digit-divided input signal by retaining in an N-fold zero-order hold circuit a value of a signal input to the ΔΣ modulator 20 within a time represented by the reciprocal of the bit rate M, and sampling the value of the signal retained within the time represented by the reciprocal of the bit rate M by means of a sampling circuit N times. For example, as shown in FIG. 3, when the number of parallel processes N is 3 and the value of the signal input to the ΔΣ modulator 20 is 0.625, the N-fold zero-order hold circuit retains the signal value 0.625 within the time represented by the reciprocal of the bit rate M, the sampling circuit performs sampling within the time represented by the reciprocal of the bit rate M three times, and the digit-divided input signal "1010" is generated each of the three times.

A second method of generating a digit-divided input signal is one that generates a digit-divided input signal by performing upsampling by means of an FIR (Finite Impulse Response) filter and performing M×N oversampling by means of an oversampling circuit. Specifically, the second method is one that generates a digit-divided input signal by performing N-fold upsampling of an input signal to the ΔΣ modulator 20 having a bit rate of M within a time represented by the reciprocal of the bit rate M by means of the FIR filter. For example, as shown in FIG. 4, when the number of parallel processes N is 3, the FIR filter performs three-fold upsampling within the time represented by the reciprocal of the bit rate M, and generates from the signals having values of 0.625, 0.6875, and 0.625, the digit-divided input signals "1010", "1011", and "1010".

Figure 5:
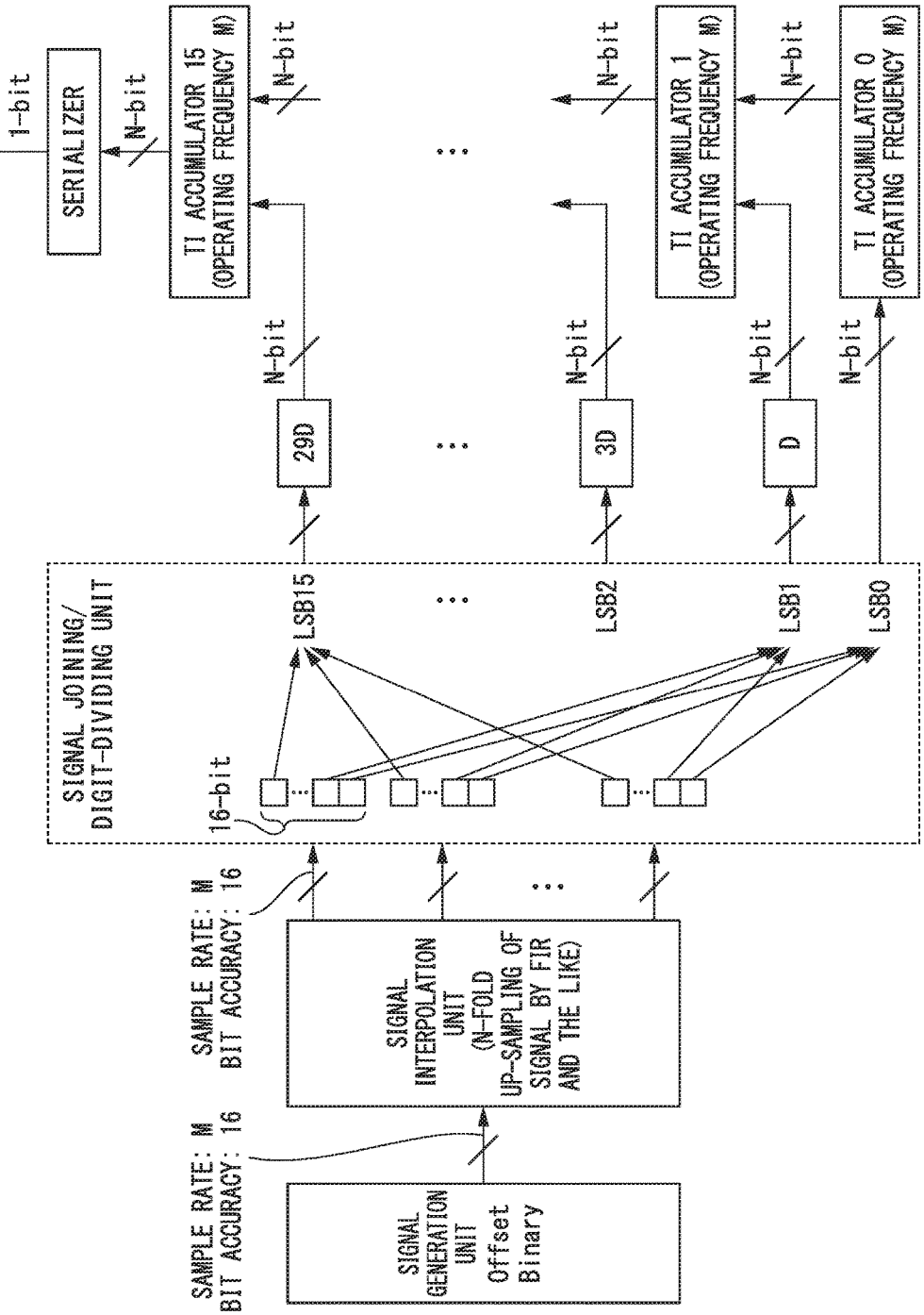
FIG. 5 is a diagram showing a circuit that generates a digit-divided input signal according to the present exemplary embodiment.

A circuit that generates a digit-divided input signal by using the FIR filter is a circuit of the manner shown in FIG. 5.

A signal interpolation unit in FIG. 5 includes a functional unit that performs processing equivalent to the FIR filter and the oversampling circuit shown in FIG. 4, and performs conversion to a sampling rate of M×N by using the functional unit to perform N-fold upsampling of a signal having the sampling rate M with an offset binary (unsigned) generated by a signal generation unit. A signal joining/digit-dividing unit, after joining the converted signal every N consecutive samplings, performs division into each digit after forming a single block, and performs output from the least significant bit LSB0 to the most significant bit LSB15 as an N-bit signal having the operating frequency M.

The signals LSB1, LSB2, ..., LSB15 output from the signal joining/digit-dividing unit are such that a delay corresponding to a latency that occurs in the TI accumulator for each digit is integrated to the input and added by delay circuits D, 3D, ..., 29D such as a D latch. The delay amount of a certain digit LSB is delayed by adding a latency amount that occurs in the next lowest order TI accumulator in addition to the delay of the LSB corresponding to the next lowest order digit. (In the example shown in FIG. 5, the latency of the TI accumulator 0 is one clock of the operating frequency M, and the latency of the other TI accumulators is two clocks of the operating frequency M.)

As a result, each TI accumulator realizes synchronized calculation for each digit, and ultimately a ΔΣ modulated output bit sequence is obtained at the output of the most significant bit.

The TI accumulator 200 according to the present exemplary embodiment will be described.

Figure 6:
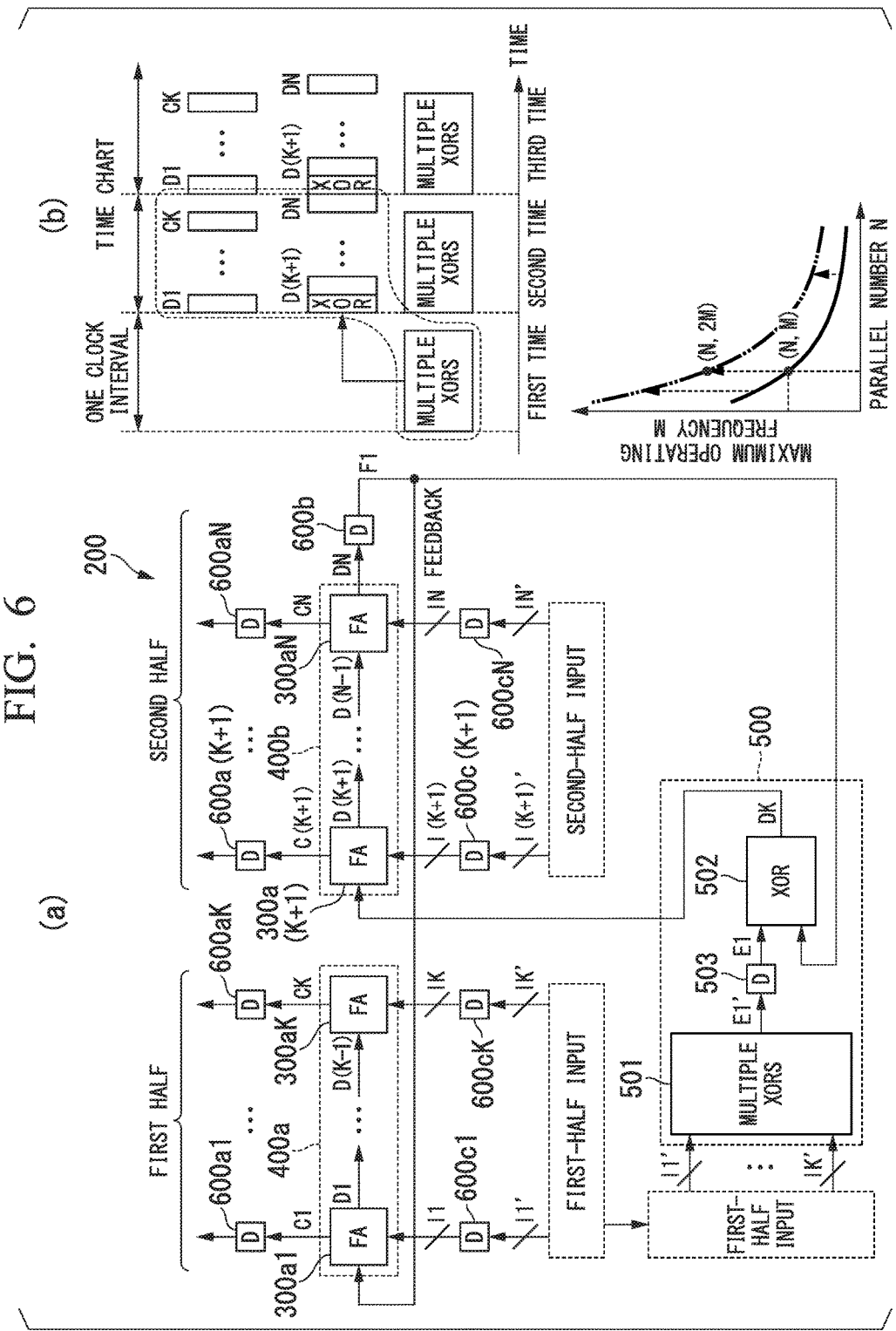
FIG. 6 is a diagram showing a configuration of a TI accumulator according to the present exemplary embodiment.

As shown in (a) of FIG. 6, the TI accumulator 200 includes a first adder sequence 400*a*, a second adder sequence 400*b*, an input calculation unit 500, and a plurality of D latches 600 (600*a*1 to 600*a*N, 600*b*, and 600*c*1 to 600*c*N).

The first adder sequence 400*a* includes K FAs 300*a*1 to 300*a*K.

To the FA 300*a*1 is input a signal I1 in which a two-bit signal I1' within a first-half input corresponding to the FA 300*a*1 is delayed by the D latch 600*c*1. Furthermore, to the FA 300*a*1 is input a signal F1 in which a sum bit DN output by the FA 300*a*N is delayed by the D latch 600*b*.

The FA 300*a*1 adds the input signal I1 and signal F1, and calculates a sum bit D1 and a carry C1. The FA 300*a*1 outputs the calculated sum bit D1 to the FA 300*a*2. Moreover, the FA 300*a*1 delays the calculated carry C1 via the D latch 600*a*1, and outputs it to a TI accumulator 200 that performs processing of a signal of a bit one order higher in the input signal than its own TI accumulator 200. For example, the FA 300*a*1 of the TI accumulator 200*a*1 delays the calculated carry C1 via the D latch 600*a*1, and outputs it to the TI accumulator 200*a*2.

To the FA 300*a*2 is input a signal I2 in which a two-bit signal I2' within a first-half input corresponding to the FA300*a*2 is delayed by the D latch 600*c*2. Furthermore, to the FA 300*a*2 is input the sum bit D1 output by the FA 300*a*1.

The FA 300*a*2 adds the input signal I2 and the sum bit D1, and calculates a sum bit D2 and a carry bit C2. The FA 300*a*2 outputs the calculated sum bit D2 to the FA 300*a*3. Moreover, the FA 300*a*2 delays the calculated carry bit C2 via the D latch 600*a*2, and outputs it to a TI accumulator 200 that performs processing of a signal of a bit one order higher in the input signal than its own TI accumulator 200.

In the same manner, to the FA 300*a*(K−1) is input a signal I(K−1) in which a two-bit signal I(K−1)' within a first-half input corresponding to the FA300*a*(K−1) is delayed by the D latch 600*c*(K−1). Furthermore, to the FA 300*a*(K−1) is input the sum bit D(K−2) output by the FA 300*a*(K−2).

The FA 300*a*(K−1) adds the input signal I(K−1) and the sum bit D(K−2), and calculates a sum bit D(K−1) and a carry bit C(K−1). The FA 300*a*(K−1) outputs the calculated sum bit D(K−1) to the FA 300*a*K. Moreover, the FA 300*a*(K−1) delays the calculated carry bit C(K−1) via the D latch 600*a*(K−1), and outputs it to a TI accumulator 200 that performs processing of a signal of a bit one order higher in the input signal than its own TI accumulator 200.

To the FA 300aK is input a signal IK in which a two-bit signal IK' within a first-half input corresponding to the FA 300aK is delayed by the D latch 600cK. Furthermore, to the FA 300aK is input the sum bit D(K−1) output by the FA 300a(K−1).

The FA 300aK adds the input signal IK and the sum bit D(K−1), and calculates a carry bit CK. The FA 300aK delays the calculated carry bit CK via the D latch 600aK, and outputs it to a TI accumulator 200 that performs processing of a signal of a bit one order higher in the input signal than its own TI accumulator 200.

The input calculation unit 500 includes multiple XORs (parity calculation units) 501, an XOR 502, and a D latch 503.

To the multiple XORs 501 is simultaneously input the same input signals as the first-half inputs I1' to IK' that are respectively input to the D latches 600c1 to 600cK. The multiple XORs 501 calculate an exclusive OR E1' with respect to the input first-half inputs I1' to IK'. The multiple XORs 501 output the calculation result E1' to the D latch 503.

To the D latch 503 is input the calculation result E1' from the multiple XORs 501. The D latch 503 outputs to the XOR 502 a signal E1 obtained by delaying the input calculation result E1'.

To the XOR 502 is input the signal E1 from the D latch 503. Furthermore, to the XOR 502 is input the signal F1 output from the D latch 600b.

The XOR 502 calculates an exclusive OR DK with respect to the input signal E1 and the signal F1. The XOR 502 outputs the calculation result DK to the FA 300a(K+1).

The second adder sequence 400b includes (N−K) FAs 300a(K+1) to 300aN.

To the FA 300a(K+1) is input a signal I(K+1) in which a two-bit signal I(K+1)' within a second-half input corresponding to the FA300a(K+1) is delayed by the D latch 600c(K+1). Furthermore, to the FA 300a(K+1) is input the signal DK from the XOR 502.

The FA 300a(K+1) adds the input signal I(K+1) and the signal DK, and calculates a sum bit D(K+1) and a carry bit C(K+1). The FA 300a(K+1) outputs the calculated sum bit D(K+1) to the FA 300a(K+2). Moreover, the FA 300a(K+1) delays the calculated carry bit C(K+1) via the D latch 600a(K+1), and outputs it to a TI accumulator 200 that performs processing of a signal of a bit one order higher in the input signal than its own TI accumulator 200.

To the FA 300a(K+2) is input a signal I(K+2) in which a two-bit signal I(K+2)' within a second-half input corresponding to the FA300a(K+2) is delayed by the D latch 600c(K+2). Furthermore, to the FA 300a(K+2) is input the sum bit D(K+1) output by the FA 300a(K+1).

The FA 300a(K+2) adds the input signal I(K+2) and the sum bit D(K+1), and calculates a sum bit D(K+2) and a carry bit C(K+2). The FA 300a(K+2) outputs the calculated sum bit D(K+2) to the FA 300a(K+3). Moreover, the FA 300a(K+2) delays the calculated carry bit C(K+2) via the D latch 600a(K+2), and outputs it to a TI accumulator 200 that performs processing of a signal of a bit one order higher in the input signal than its own TI accumulator 200.

In the same manner, to the FA 300aN is input a signal IN in which a two-bit signal IN' within a second-half input corresponding to the FA300aN is delayed by the D latch 600cN. Furthermore, to the FA 300aN is input the sum bit D(N−1) output by the FA 300a(N−1).

The FA 300aN adds the input signal IN and the sum bit D(N−1), and calculates a sum bit DN and a carry bit CN. The FA 300aN delays the calculated sum bit DN via the D latch 600b, and outputs it to the XOR 502. Moreover, the FA 300aN delays the calculated carry bit CN via the D latch 600aN, and outputs it to a TI accumulator 200 that performs processing of a signal of a bit one order higher in the input signal than its own TI accumulator 200.

The input calculation unit 500 performs the same calculations as the calculations performed by the first adder sequence 400a with respect to the first-half input.

As shown in (b) of FIG. 6, the TI accumulator 200 completes calculation in the input operation unit 500 with respect to the first-half inputs I1' to IK' at a timing one clock earlier than the second adder sequence 400b. Then, the TI accumulator 200 performs in parallel a calculation with respect to the first-half inputs I1 to IK by means of the input calculation unit 500, and a calculation with respect to the second-half inputs I(K+1) to IN by means of the second adder sequence 400b at the timing of the next clock input or later.

In the TI accumulator 200, when the number of FAs K included in the first adder sequence 400a is equal to the number of FAs (N−K) included in the second adder sequence 400b, that is to say, when K=N÷2, the calculation time of the first adder sequence 400a and the calculation time of the second adder sequence 400b essentially become equal. Furthermore, since the number of parallel processes in the first adder sequence 400a and the second adder sequence 400b respectively become N÷2, the maximum operating frequency of the TI accumulator 200 is approximately twice the maximum frequency of the TI accumulator 100. That is to say, it can be made 2M. On the other hand, since the first adder sequence 400a and the second adder sequence 400b are performing parallel processing, it is possible to finish N-fold parallel processing within the time represented by the reciprocal of the maximum operating frequency 2M.

The input calculation unit 500 is configured as described below with reference to FIG. 7.

Figure 7:
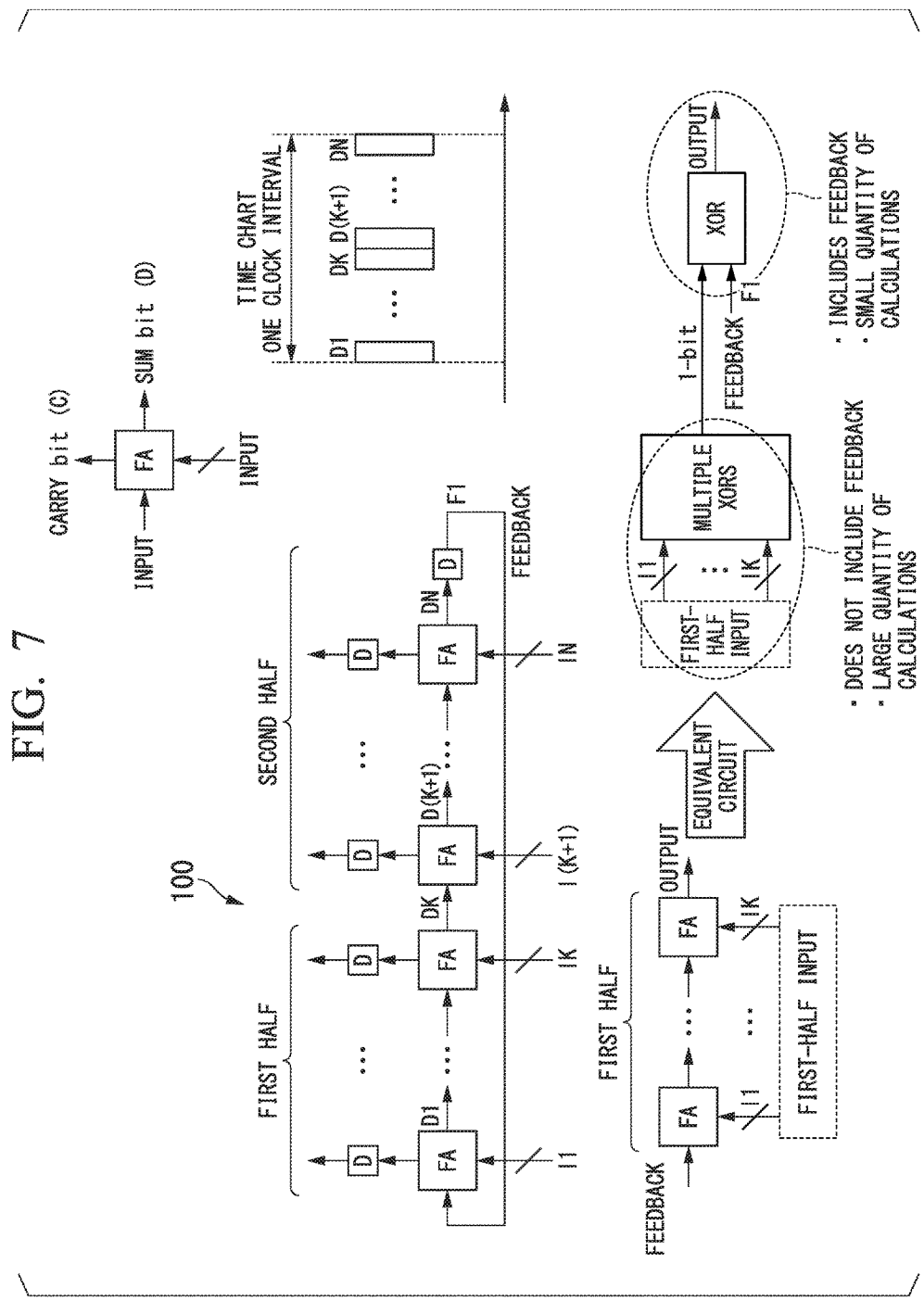
FIG. 7 is a diagram for describing an input calculation unit according to the present exemplary embodiment.
Figure 17:
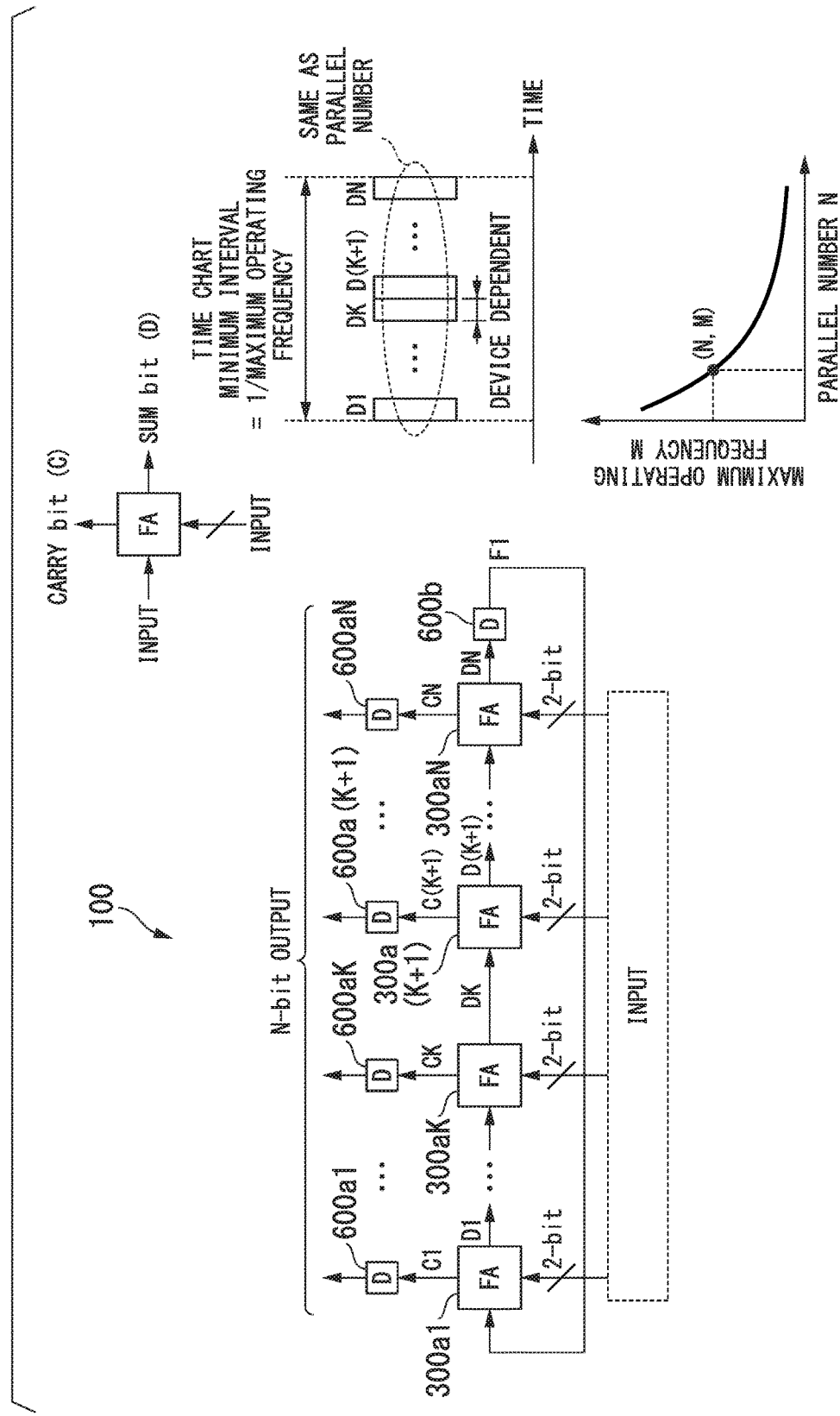
FIG. 17 is a diagram showing a configuration of a related TI accumulator.

As shown in FIG. 7, in a case where the N FAs 300a1 to 300aN included in the TI accumulator 100 shown in FIG. 17 are divided into first-half FAs 300a1 to 300aK and second-half FAs 300a(K+1) to 300aN, the processing performed by the first-half FAs 300a1 to 300aK may use a characteristic of FA calculations, in which the result does not change whether the calculation of the feedback signal F1 is performed before or after, to calculate an exclusive OR of the first-half input, such that it can be substituted by processing that calculates the exclusive OR of the calculation result thereof and the feedback signal.

However, in the input calculation unit 500, the calculation timing and the output timing of the calculation result are made correct using the D latch 503 and the D latch 600.

Figure 8:
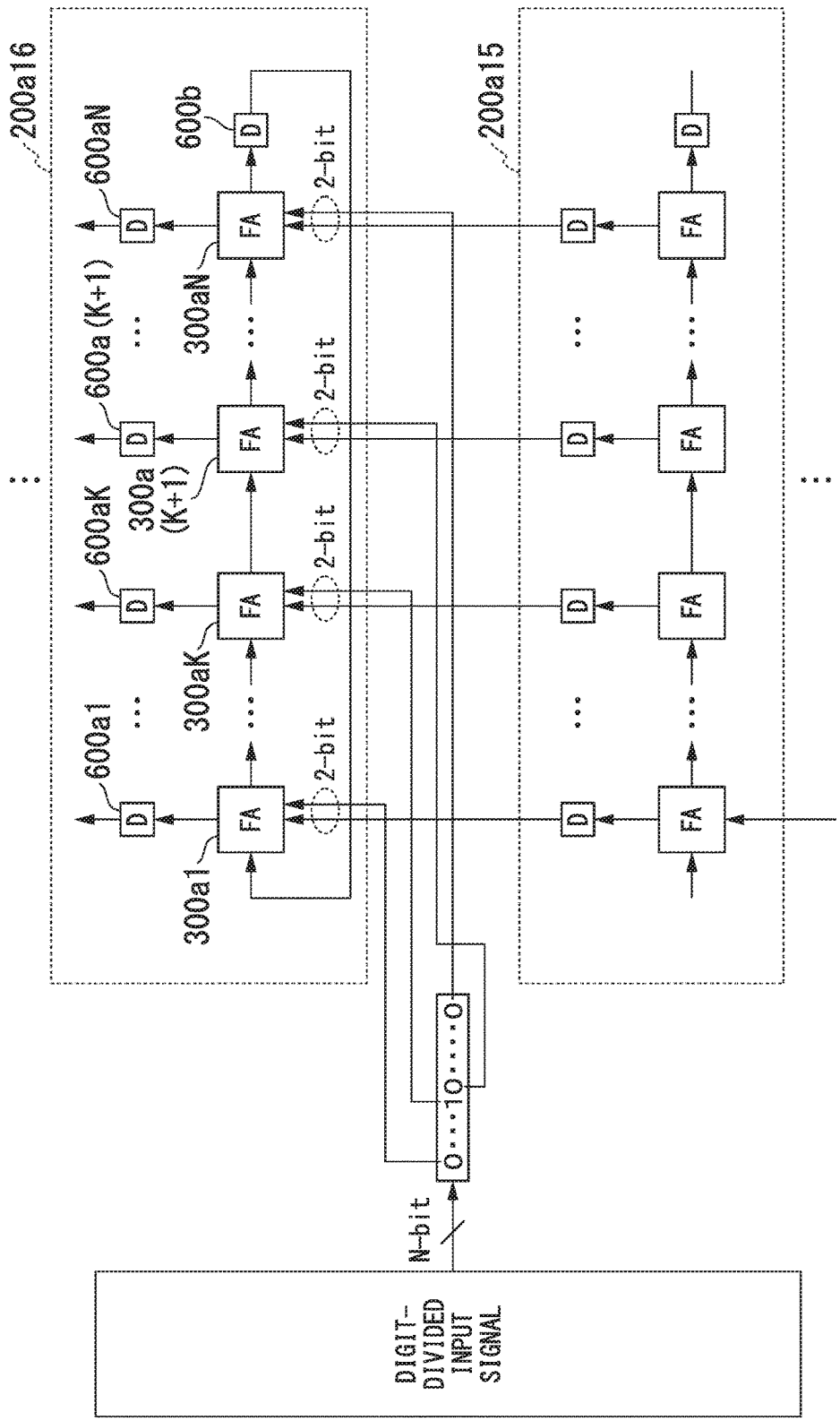
FIG. 8 is a diagram for describing a first-half input and a second-half input in the TI accumulator according to the present exemplary embodiment.

The first-half input and the second-half input in the TI accumulator 200 are signals in which N one-bit signals input from the digit-divided input signal and the N one-bit signals output by the TI accumulator 200 that performs processing of an input signal of the ΔΣ modulator 20 that is one order lower than its own TI accumulator 200, are made into N sets of two signals whose order is determined beforehand for each set. As shown in FIG. 8, it is an input signal that is input to the respective FAs 300 as two-bit signals in which the signals first to Kth in the sequence are the first-half input, and the signals (K+1)th to Nth in the sequence are the second-half input in accordance with the division of the adder sequences. For example, the signal input to the FA 300a1 in the TI accumulator 200a16 shown in FIG. 2 represents a two-bit signal in which the first one-bit signal of the most significant bit (the first signal "1" with respect to 1/2 in FIG. 3), and a one-bit signal in which the carry C1 calculated by the FA 300a1 in the TI accumulator 200a15 has been delayed by the D latch 600a1, have been combined.

The foregoing has described the TI accumulator 200 in the ΔΣ modulator 20 included in the transmitter 1 according to the first exemplary embodiment of the present invention. The TI accumulator 200 described above is configured by the first adder sequence 400a and the second adder sequence 400b having multiple adders that are respectively connected in series, has an adder sequence that performs feedback of the result of the second adder sequence 400b as an input to the first adder sequence 400a, processes the input supplied in parallel to the multiple adders of the first adder sequence 400a, and supplies it to the second adder sequence 400b. The serializer in the ΔΣ modulator 20 performs parallel-serial conversion of the N-bit output of the most significant bit 200a16 having the operating frequency 2M, and outputs it by bundling it into a one-bit sequence with a bit rate of 2M×N.

In this manner, the ΔΣ modulator 20 included in the transmitter 1 realizes a 2M×N bit rate equivalent to a ΔΣ modulator having an operating frequency of 2M×N, and can perform high-speed ΔΣ modulation.

Second Exemplary Embodiment

A transmitter including a ΔΣ modulator according to a second exemplary embodiment of the present invention will be described.

The transmitter 1 according to the present exemplary embodiment includes, in the same manner as the transmitter 1 according to the first exemplary embodiment of the present invention shown in FIG. 1, a baseband signal generator 10, a ΔΣ modulator 20, a class D power amplifier 30, a band pass filter 40, and an antenna 50.

The ΔΣ modulator 20 according to the present exemplary embodiment includes, in the same manner as the ΔΣ modulator 20 according to the first exemplary embodiment, the same number of TI accumulators 200 (200a1, 200a2, 200a3, . . . ) as the bit precision of the input signal.

However, the TI accumulator 200 according to the present exemplary embodiment is different from the TI accumulator 200 according to the first exemplary embodiment with respect to connection of the D latches 503 and 600b.

Figure 9:
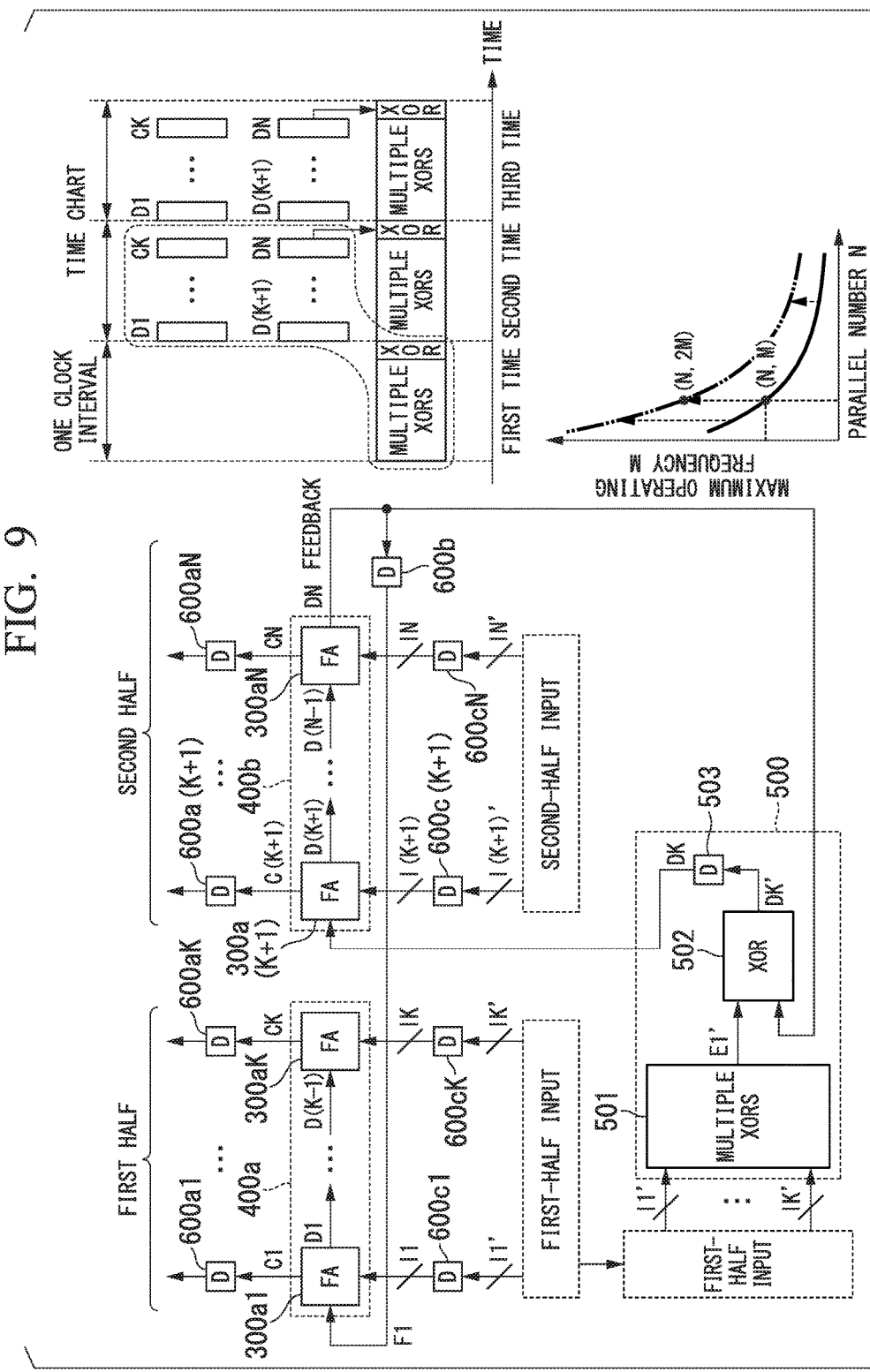
FIG. 9 is a diagram showing a configuration of a TI accumulator according to a second exemplary embodiment of the present invention.

As shown in FIG. 9, the TI accumulator 200 according to the present exemplary embodiment includes a first adder sequence 400a, a second adder sequence 400b, an input calculation unit 500, and a plurality of D latches 600 (600a1 to 600aN, 600b, and 600c1 to 600cN).

The input calculation unit 500 includes multiple XORs 501, an XOR 502, and a D latch 503.

To the multiple XORs 501 are simultaneously input the same input signals as the first-half inputs I1' to IK' that are respectively input to the D latches 600c1 to 600cK. The multiple XORs 501 calculate an exclusive OR E1' with respect to the input first-half inputs I1' to IK'. The multiple XORs 501 output the calculation result E1' to the XOR 502.

To the XOR 502 is input the signal E1' from the multiple XORs 501. Furthermore, to the XOR 502 is input the signal DN output from the FA 300aN.

The XOR 502 calculates an exclusive OR DK' with respect to the input signal E1' and the signal DN. The XOR 502 outputs the calculation result DK' to the D latch 503.

To the D latch 503 is input the calculation result DK' from the XOR 502. The D latch 503 outputs to the FA 300a(K+1) a signal DK, in which the input calculation result DK' has been delayed.

To the FA 300a(K+1) is input a signal I(K+1) in which a two-bit signal I(K+1)' within a second-half input corresponding to the FA 300a(K+1) is delayed by the D latch 600c(K+1). Furthermore, to the FA 300a(K+1) is input the signal DK from the D latch 503.

The FA 300a(K+1) adds the input signal I(K+1) and the signal DK, and calculates a sum bit D(K+1) and a carry bit C(K+1). The FA 300a(K+1) outputs the calculated sum bit D(K+1) to the FA 300a(K+2). Moreover, the FA 300a(K+1) delays the calculated carry bit C(K+1) via the D latch 600a(K+1), and outputs it to a TI accumulator 200 that performs processing of a signal of a bit one order higher in the input signal than its own TI accumulator 200.

In the same manner, to the FA 300aN is input a signal IN in which a two-bit signal IN' within a second-half input corresponding to the FA300aN is delayed by the D latch 600cN. Furthermore, to the FA 300aN is input the sum bit D(N−1) output by the FA 300a(N−1).

The FA 300aN adds the input signal IN and the sum bit D(N−1), and calculates a sum bit DN and a carry bit CN. The FA 300aN outputs the calculated sum bit DN to the XOR 502 and the D latch 600b. Moreover, the FA 300aN delays the calculated carry bit CN via the D latch 600aN, and outputs it to a TI accumulator 200 that performs processing of a signal of a bit one order higher in the input signal than its own TI accumulator 200.

To the D latch 600b is input the sum bit DN from the FA 300aN. The D latch 600b outputs to the FA 300a1 a signal F1 in which the input sum bit DN has been delayed.

To the FA 300a1 is input a signal I1 in which a two-bit signal I1' within a first-half input corresponding to the FA300a1 is delayed by the D latch 600c1. Furthermore, to the FA 300a1 is input a signal F1 from the D latch 600b.

The FA 300a1 adds the input signal I1 and the signal F1, and calculates a sum bit D1 and a carry C1. The FA 300a1 outputs the calculated sum bit D1 to the FA 300a2. Moreover, the FA 300a1 delays the calculated carry C1 via the D latch 600a1, and outputs it to a TI accumulator 200 that performs processing of a signal of a bit one order higher in the input signal than its own TI accumulator 200. For example, the FA 300a1 of the TI accumulator 200a1 delays the calculated carry C1 via the D latch 600a1, and outputs it to the TI accumulator 200a2.

As shown in FIG. 9, the TI accumulator 200 completes calculation in the input calculation unit 500 with respect to the first-half inputs I1' to IK' at a timing one clock earlier than the second adder sequence 400b. Then, the TI accumulator 200 performs in parallel a calculation with respect to the first-half inputs I1 to IK by means of the input calculation unit 500, and a calculation with respect to the second-half inputs I(K+1) to IN by means of the second adder sequence 400b, at the timing of the next clock input or later.

The foregoing has described the TI accumulator 200 in the ΔΣ modulator 20 included in the transmitter 1 according to the second exemplary embodiment of the present invention. The TI accumulator 200 described above is configured by the first adder sequence 400a and the second adder sequence 400b having multiple adders that are respectively connected in series, has an adder sequence that performs feedback of the result of the second adder sequence 400b as an input to the first adder sequence 400a, processes the input supplied in parallel to the multiple adders of the first adder sequence 400a, and supplies it to the second adder sequence 400b.

In this manner, the ΔΣ modulator 20 included in the transmitter 1 can perform high-speed ΔΣ modulation.

Third Exemplary Embodiment

A transmitter including a ΔΣ modulator according to a third exemplary embodiment of the present invention will be described.

The transmitter 1 according to the present exemplary embodiment includes, in the same manner as the transmitter 1 according to the first exemplary embodiment of the present invention shown in FIG. 1, a baseband signal generator 10, a ΔΣ modulator 20, a class D power amplifier 30, a band pass filter 40, and an antenna 50.

The ΔΣ modulator 20 according to the present exemplary embodiment includes, in the same manner as the ΔΣ modulator 20 according to the first exemplary embodiment, the same number of TI accumulators 200 (200a1, 200a2, 200a3, . . . ) as the bit precision of the input signal.

However, the TI accumulator 200 according to the present exemplary embodiment is different from the TI accumulator 200 according to the first exemplary embodiment.

Figure 10:
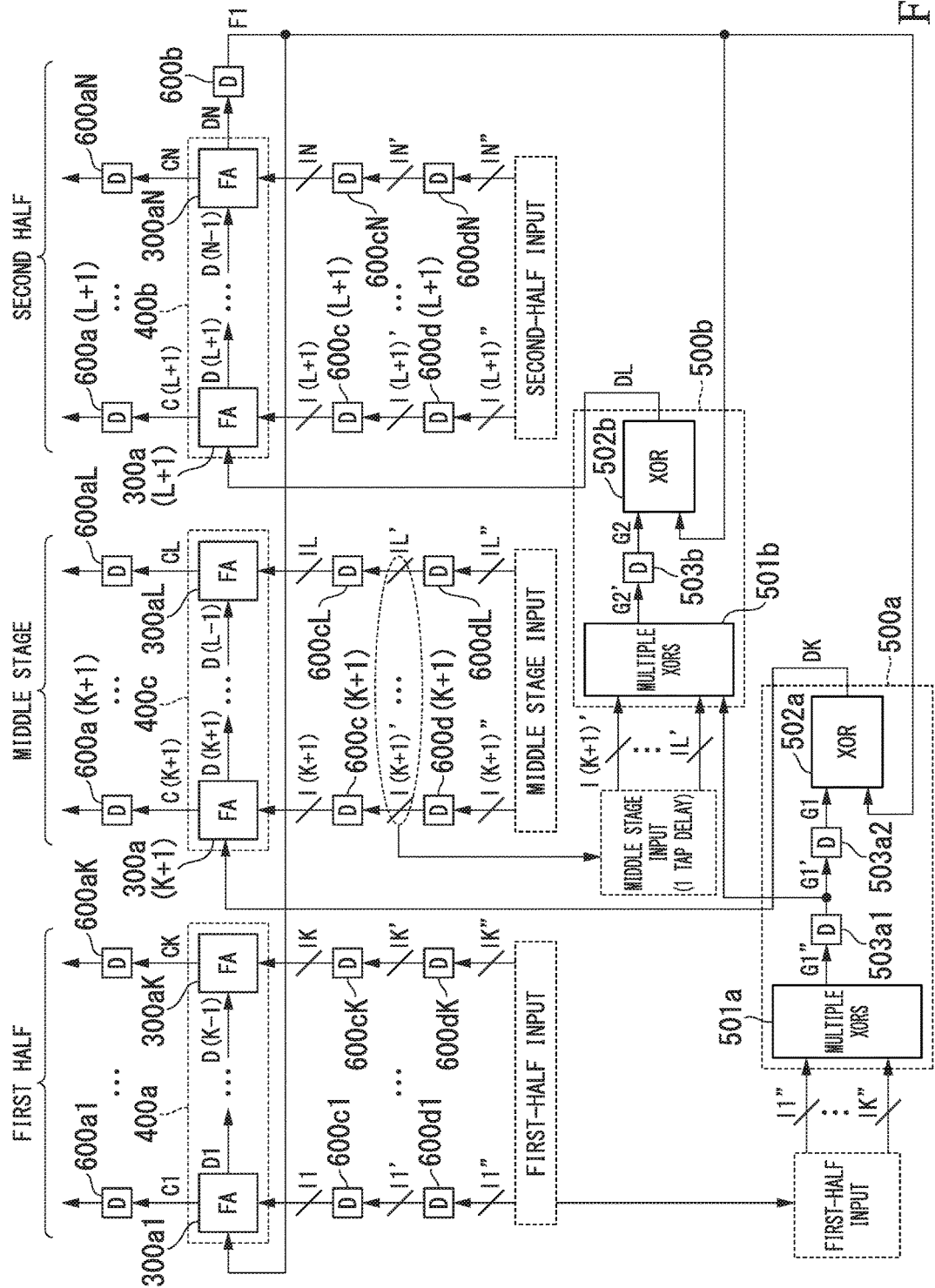
FIG. 10 is a first diagram showing a configuration of a TI accumulator according to a third exemplary embodiment of the present invention.

As shown in FIG. 10, the TI accumulator 200 according to the present exemplary embodiment includes a first adder sequence 400a, a second adder sequence 400b, a third adder sequence 400c, a first input calculation unit 500a, a second input calculation unit 500b, and a plurality of D latches 600 (600a1 to 600aN, 600b, 600c1 to 600cN, and 600d1 to 600dN).

The first adder sequence 400a includes K FAs 300a1 to 300aK.

To the FA 300a1 is input a signal I1 in which a two-bit signal I1' within a first-half input corresponding to the FA300a1 is delayed by the D latch 600d1 (signal I1'), and further delayed by the D latch 600c1. Furthermore, to the FA 300a1 is input a signal F1 in which a sum bit DN output by the FA 300aN is delayed by the D latch 600b.

The FA 300a1 adds the input signal I1 and the signal F1, and calculates a sum bit D1 and a carry C1. The FA 300a1 outputs the calculated sum bit D1 to the FA 300a2. Moreover, the FA 300a1 delays the calculated carry C1 via the D latch 600a1, and outputs it to a TI accumulator 200 that performs processing of a signal of a bit one order higher in the input signal than its own TI accumulator 200.

To the FA 300a2 is input a signal I2 in which a two-bit signal I2" within a first-half input corresponding to the FA300a2 is delayed by the D latch 600d2 (signal I2'), and further delayed by the D latch 600c2. Furthermore, to the FA 300a2 is input the sum bit D1 output by the FA 300a1.

The FA 300a2 adds the input signal I2 and the sum bit D1, and calculates a sum bit D2 and a carry bit C2. The FA 300a2 outputs the calculated sum bit D2 to the FA 300a3. Moreover, the FA 300a2 delays the calculated carry bit C2 via the D latch 600a2, and outputs it to a TI accumulator 200 that performs processing of a signal of a bit one order higher in the input signal than its own TI accumulator 200.

To the FA 300a(K-1) is input a signal I(K-1) in which a two-bit signal I(K-1)" within a first-half input corresponding to the FA300a(K-1) is delayed by the D latch 600d(K-1) (signal I(K-1)'), and further delayed by the D latch 600c(K-1). Furthermore, to the FA 300a(K-1) is input the sum bit D(K-2) output by the FA 300a(K-2).

The FA 300a(K-1) adds the input signal I(K-1) and the sum bit D(K-2), and calculates a sum bit D(K-1) and a carry bit C(K-1). The FA 300a(K-1) outputs the calculated sum bit D(K-1) to the FA 300aK. Moreover, the FA 300a(K-1) delays the calculated carry bit C(K-1) via the D latch 600a(K-1), and outputs it to a TI accumulator 200 that performs processing of a signal of a bit one order higher in the input signal than its own TI accumulator 200.

In the same manner, to the FA 300aK is input a signal IK in which a two-bit signal IK" within a first-half input corresponding to the FA300aK is delayed by the D latch 600dK (signal IK'), and further delayed by the D latch 600cK. Furthermore, to the FA 300aK is input the sum bit D(K-1) output by the FA 300a(K-1).

The FA 300aK adds the input signal IK and the sum bit D(K-1), and calculates a carry bit CK. The FA 300aK delays the calculated carry bit CK via the D latch 600aK, and outputs it to a TI accumulator 200 that performs processing of a signal of a bit one order higher in the input signal than its own TI accumulator 200.

The first input calculation unit 500a includes multiple XORs 501a, an XOR 502a, a D latch 503a1, and a D latch 503a2.

To the multiple XORs 501a are simultaneously input the same input signals as the first-half inputs I1" to IK" that are respectively input to the D latches 600d1 to 600dK. The multiple XORs 501a calculate an exclusive OR G1" with respect to the input first-half inputs I1" to IK". The multiple XORs 501a output the calculation result G1" to the D latch 503a1.

To the D latch 503a1 is input the calculation result G1" from the multiple XORs 503a. The D latch 503a1 outputs to the D latch 503a2 and the second input calculation unit 500b a signal G1' obtained by delaying the input calculation result G1".

To the D latch 503a2 is input the signal G1' from the D latch 503a1. The D latch 503a2 outputs to the XOR 502a a signal G1 obtained by delaying the input signal G1'.

To the XOR 502a is input the signal G1 from the D latch 503a2. Furthermore, to the XOR 502a is input a signal F1 in which the sum bit DN output by the FA300aN has been delayed by the D latch 600b.

The XOR 502a calculates an exclusive OR DK with respect to the input signal G1 and the signal F1. The XOR 502a outputs the calculation result DK to the FA 300a(K+1).

The third adder sequence 400c includes (L-K) FAs 300a(K+1) to 300aL.

To the FA 300a(K+1) is input a signal I(K+1) in which a two-bit signal I(K+1)" within a middle stage input corresponding to the FA 300a(K+1) is delayed by the D latch 600d(K+1) (signal I(K+1)'), and further delayed by the D latch 600c(K+1). Furthermore, to the FA 300a(K+1) is input the signal DK from the XOR 502a.

The FA 300a(K+1) adds the input signal I(K+1) and the signal DK, and calculates a sum bit D(K+1) and a carry bit C(K+1). The FA 300a(K+1) outputs the calculated sum bit D(K+1) to the FA 300a(K+2). Moreover, the FA 300a(K+1) delays the calculated carry bit C(K+1) via the D latch 600a(K+1), and outputs it to a TI accumulator 200 that performs processing of a signal of a bit one order higher in the input signal than its own TI accumulator 200.

To the FA 300a(L-1) is input a signal I(L-1) in which a two-bit signal I(L-1)" within a middle stage input corresponding to the FA 300a(L-1) is delayed by the D latch 600d(L-1) (signal I(L-1)'), and further delayed by the D latch 600c(L-1). Furthermore, to the FA 300a(L-1) is input a sum bit D(L-2) output by the FA 300a(L-2).

The FA 300a(L-1) adds the input signal I(L-1) and the sum bit D(L-2), and calculates a sum bit D(L-1) and a carry bit C(L-1). The FA 300a(L-1) outputs the calculated sum bit D(L−1) to the FA 300aL. Moreover, the FA 300a(L−1) delays the calculated carry bit C(L−1) via the D latch 600a(L−1), and outputs it to a TI accumulator 200 that performs processing of a signal of a bit one order higher in the input signal than its own TI accumulator 200.

In the same manner, to the FA 300aL is input a signal IL in which a two-bit signal IL" within a middle stage input corresponding to the FA 300aL is delayed by the D latch 600dL (signal IL'), and further delayed by the D latch 600cL. Furthermore, to the FA 300aL is input the sum bit D(L−1) output by the FA 300a(L−1).

The FA 300aL adds the input signal IL and the sum bit D(L−1), and calculates a carry bit CL. The FA 300aL delays the calculated carry bit CL via the D latch 600aL, and outputs it to a TI accumulator 200 that performs processing of a signal of a bit one order higher in the input signal than its own TI accumulator 200.

The second input calculation unit 500b includes multiple XORs 501b, an XOR 502b, and a D latch 503b.

To the multiple XORs 501b are simultaneously input the same input signals as the middle stage inputs I(K+1)' to IL' that are respectively input to the D latches 600c1 to 600cL. The multiple XORs 501b calculate an exclusive OR G2' with respect to the input middle stage inputs I(K+1)' to IL'. The multiple XORs 501b output the calculation result G2' to the D latch 503b.

To the D latch 503b is input the calculation result G2' from the multiple XORs 501b. The D latch 503b outputs to the XOR 502b a signal G2 obtained by delaying the input calculation result G2'.

To the XOR 502b is input the signal G2 from the D latch 503b. Furthermore, to the XOR 502b is input a signal F1 in which the sum bit DN output by the FA300aN has been delayed by the D latch 600b.

The XOR 502b calculates an exclusive OR DL with respect to the input signal G2 and the signal F1. The XOR 502b outputs the calculation result DL to the FA 300a(L+1).

The second adder sequence 400b includes (N−L) FAs 300a(L+1) to 300aN.

To the FA 300a(L+1) is input a signal I(L+1) in which a two-bit signal I(L+1)" within a second-half input corresponding to the FA 300a(K+1) is delayed by the D latch 600d(L+1) (signal I(L+1)'), and further delayed by the D latch 600c(L+1). Furthermore, to the FA 300a(L+1) is input the signal DL from the XOR 502b.

The FA 300a(L+1) adds the input signal I(L+1) and the signal DL, and calculates a sum bit D(L+1) and a carry bit C(L+1). The FA 300a(L+1) outputs the calculated sum bit D(L+1) to the FA 300a(L+2). Moreover, the FA 300a(L+1) delays the calculated carry bit C(L+1) via the D latch 600a(L+1), and outputs it to a TI accumulator 200 that performs processing of a signal of a bit one order higher in the input signal than its own TI accumulator 200.

To the FA 300a(N−1) is input a signal I(N−1) in which a two-bit signal I(N−1)" within a second-half input corresponding to the FA 300a(N−1) is delayed by the D latch 600d(N−1) (signal I(N−1)'), and further delayed by the D latch 600c(N−1). Furthermore, to the FA 300a(N−1) is input a sum bit D(N−2) output by the FA 300a(N−2).

The FA 300a(N−1) adds the input signal I(N−1) and the sum bit D(N−2), and calculates a sum bit D(N−1) and a carry bit C(N−1). The FA 300a(N−1) outputs the calculated sum bit D(N−1) to the FA 300aN. Moreover, the FA 300a(N−1) delays the calculated carry bit C(N−1) via the D latch 600a(N−1), and outputs it to a TI accumulator 200 that performs processing of a signal of a bit one order higher in the input signal than its own TI accumulator 200.

In the same manner, to the FA 300aN is input a signal IN in which a two-bit signal IN" within a second-half input corresponding to the FA 300aN is delayed by the D latch 600dN (signal IN'), and further delayed by the D latch 600cN. Furthermore, to the FA 300aN is input the sum bit D(N−1) output by the FA 300a(N−1).

The FA 300aN adds the input signal IN and the sum bit D(N−1), and calculates a sum bit DN and a carry bit CN. The FA 300aN delays the calculated sum bit DN via the D latch 600b, and outputs it to the FA 300a1, the XOR 502a, and the XOR 502b, respectively. Furthermore, the FA 300aN delays the calculated carry bit CN via the D latch 600aN, and outputs it to a TI accumulator 200 that performs processing of a signal of a bit one order higher in the input signal than its own TI accumulator 200.

The first input calculation unit 500a performs an equivalent calculation to the calculation performed by the first adder sequence 400a with respect to a first-half input.

Furthermore, the second input calculation unit 500b performs an equivalent calculation to the calculation performed by the third adder sequence 400c with respect to a middle stage input.

Figure 11:
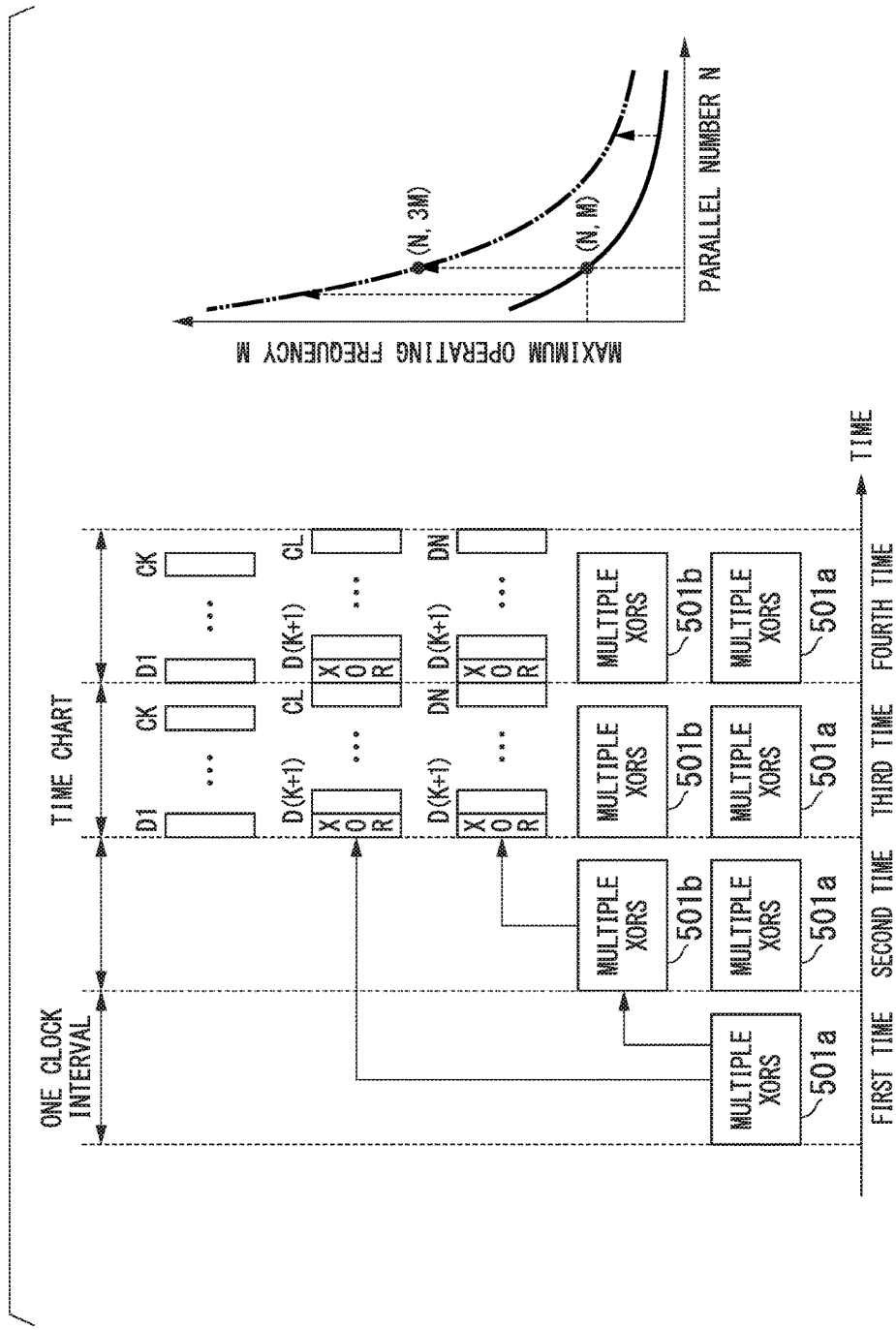
FIG. 11 is a first diagram showing a time chart of the TI accumulator according to the present exemplary embodiment.

As shown in FIG. 11, the TI accumulator 200 completes calculation in the second input calculation unit 500b with respect to the middle stage inputs I(K+1)' to IL' at a timing one clock earlier than the second adder sequence 400b. Furthermore, it completes calculation in the first input calculation unit 500a with respect to the first-half inputs IF to IK' at a timing two clocks earlier than the second adder sequence 400b. Then, the TI accumulator 200 performs in parallel a calculation with respect to the first-half inputs I1 to IK by means of the first input calculation unit 500a, a calculation with respect to the middle stage inputs I(K+1) to IL by means of the second input calculation unit 500b, and a calculation with respect to the second-half inputs I(L+1) to IN by means of the second adder sequence 400b, at the timing of the third clock input or later.

In the TI accumulator 200, when the number of FAs K included in the first adder sequence 400a, the number of FAs (N−L) included in the second adder sequence 400b, and the number of FAs (L−K) included in the third adder sequence 400c are respectively equal, the calculation time of the first adder sequence 400a, the calculation time of the second adder sequence 400b, and the calculation time of the third adder sequence 400c essentially become equal. Furthermore, since the respective number of parallel processes in the first adder sequence 400a, the second adder sequence 400b, and the third adder sequence 400c is N÷3, the maximum operating frequency of the TI accumulator 200 is approximately three times the maximum frequency of the TI accumulator 100. That is to say, it can be made 3M. On the other hand, since the first adder sequence 400a, the second adder sequence 400b, and the third adder sequence 400c are performing parallel processing, it is possible to finish N-fold parallel processing within the time represented by the reciprocal of the maximum operating frequency 3M.

A configuration of the input calculation unit 500 is considered to be as follows based on the description below referring to FIG. 12.

Figure 12:
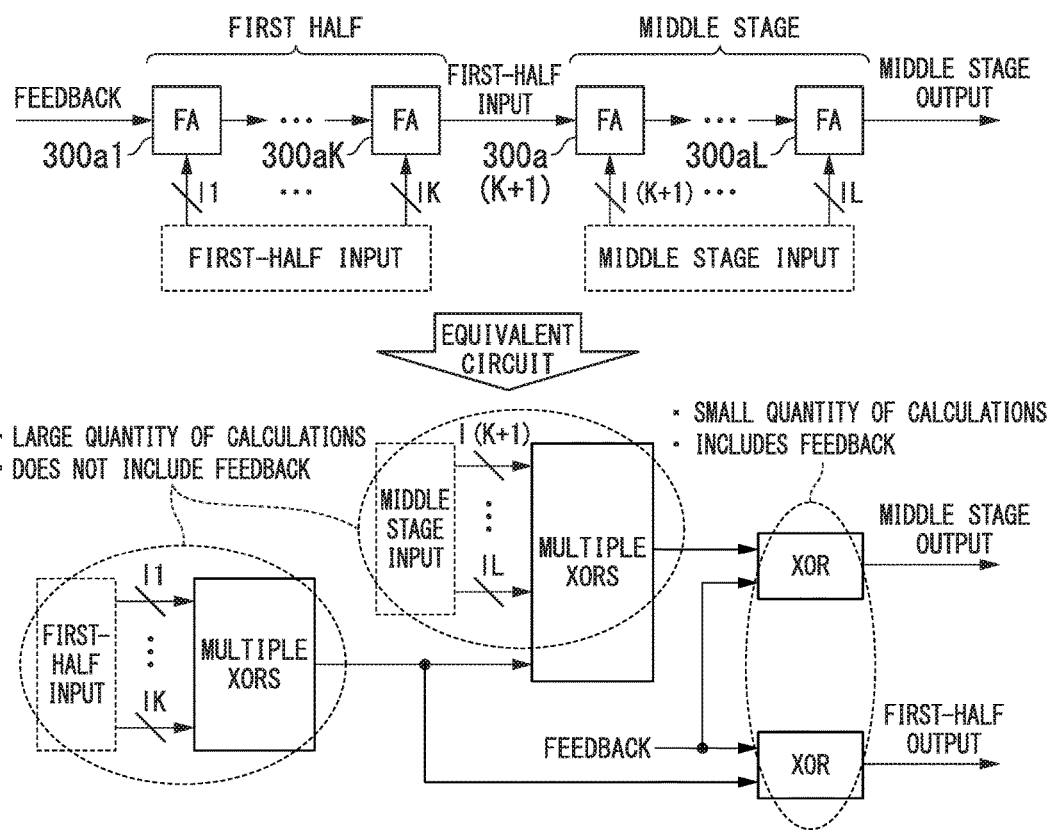
FIG. 12 is a diagram for describing an input calculation unit according to the present exemplary embodiment.

As shown in FIG. 12, in a case where the N FAs 300a1 to 300aN included in the TI accumulator 100 shown in FIG. 17 are divided into first-half FAs 300a1 to 300aK, middle stage FAs 300a(K+1) to 300aL, and second-half FAs 300a(L+1) to 300aN, the processing performed by the first-half FAs 300a1 to 300aK may use a characteristic of FA calculations, in which the result does not change whether the calculation of the feedback signal F1 is performed before or after, to calculate an exclusive OR of the first-half input, such that it can be substituted by processing that calculates the exclusive OR of the calculation result thereof and the feedback signal.

However, in the first input calculation unit 500a and the second input calculation unit 500b, the calculation timing and the output timing of the calculation result are made correct using the D latches 503a1, 503a2, and 503b, and the D 600.

Figure 13:
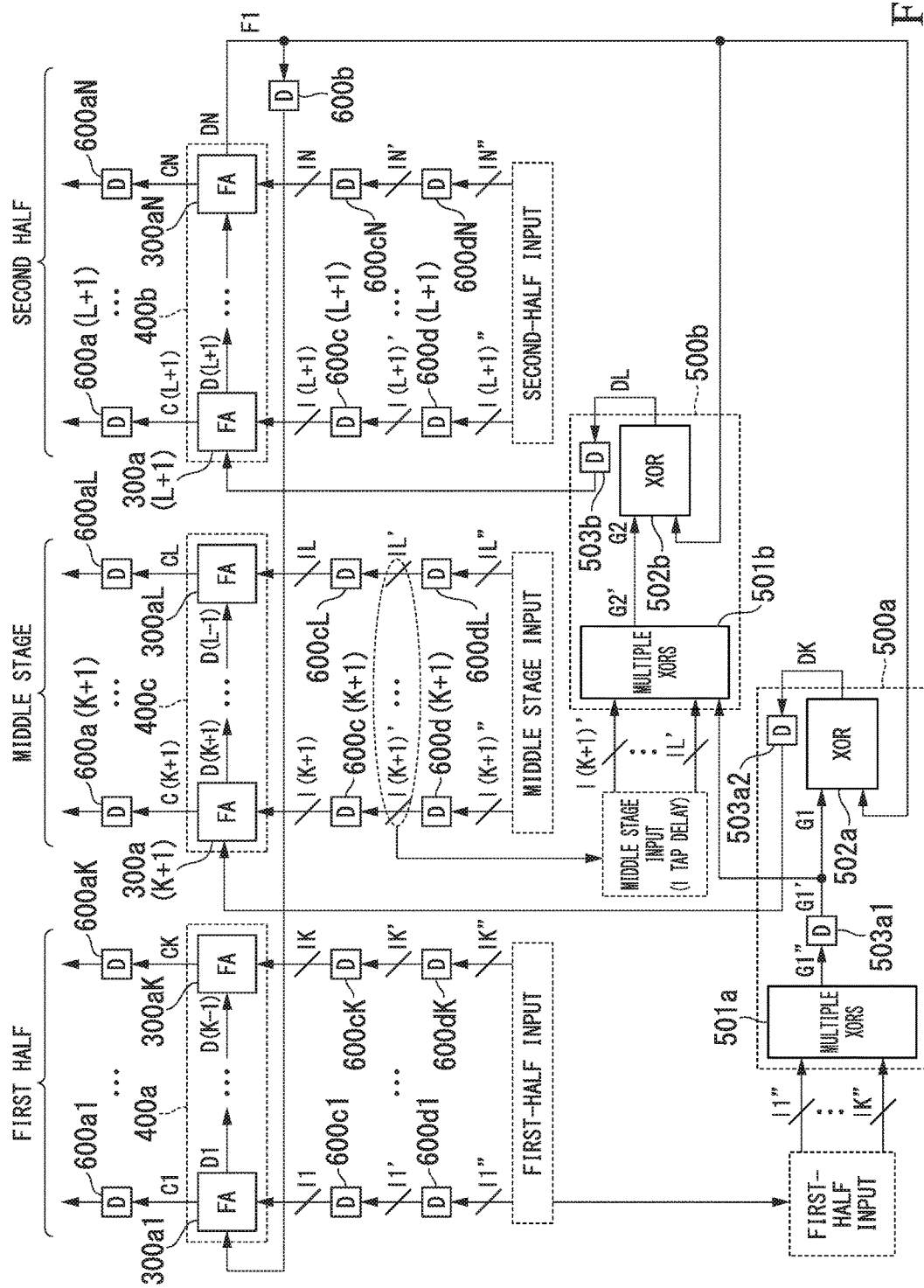
FIG. 13 is a second diagram showing a configuration of the TI accumulator according to the present exemplary embodiment.
Figure 14:
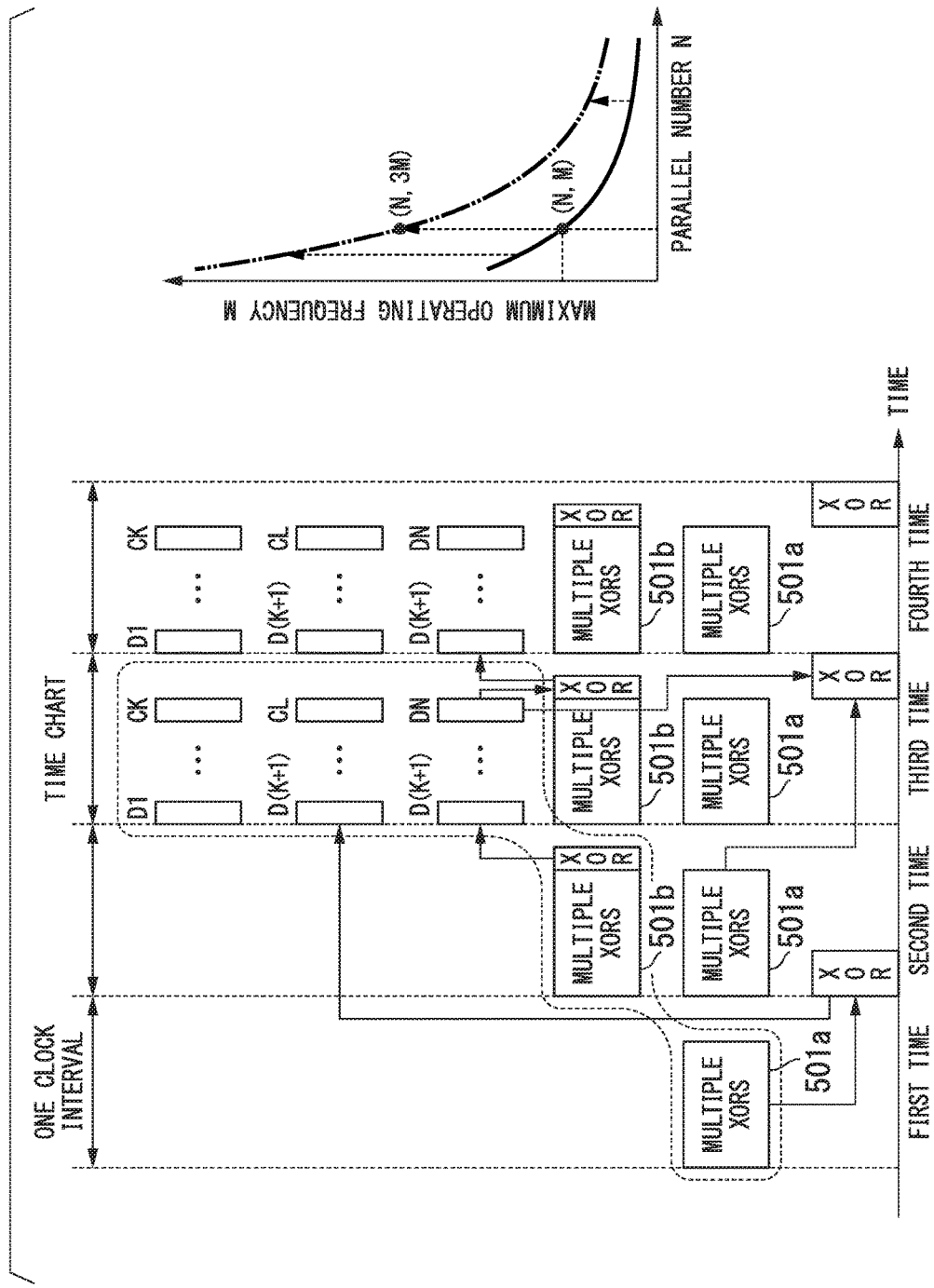
FIG. 14 is a second diagram showing a time chart of the TI accumulator according to the present exemplary embodiment.

As shown in FIG. 13, in the TI accumulator 200 according to the third exemplary embodiment, the connection of the D latches 503a2, 503b and 600b may be changed. That is to say, the D latch 503a2 may be connected the subsequent stage of the XOR 502a, the D latch 503b may be connected to the subsequent stage of the XOR 502b, and the D latch 600b may be connected to a position that delays the signal F1 only for the FA 300a1. This change is based on the same consideration as the TI accumulator 200 according to the second exemplary embodiment, in which the connection of the D latches 503 and 600b was changed with respect to the TI accumulator 200 according to the first exemplary embodiment. The TI accumulator 200 shown in FIG. 13 performs processing according to a time chart as shown in FIG. 14.

The first-half input, the middle stage input, and the second-half input in the TI accumulator 200 are signals in which N one-bit signals input from the digit-divided input signal and the N-bit one-bit signals output by the TI accumulator 200 that performs processing of an input signal of the ΔΣ modulator 20 that is one order lower than its own TI accumulator 200, are made into N sets of two signals whose order is determined beforehand for each set. Further, they are input signals that are input to the respective FAs 300 as two-bit signals in which the signals first to Kth in the sequence are the first-half input, the signals (K+1)th to Lth in the sequence are the middle stage input, and the signals (L+1)th to Nth in the sequence are the second-half input in accordance with the division of the adder sequences.

The foregoing has described the TI accumulator 200 in the ΔΣ modulator 20 included in the transmitter 1 according to the third exemplary embodiment of the present invention. The TI accumulator 200 described above is configured by the first adder sequence 400a and the second adder sequence 400b having multiple adders that are respectively connected in series, has an adder sequence that performs feedback of the result of the second adder sequence 400b as an input to the first adder sequence 400a, processes the input supplied in parallel to the multiple adders of the first adder sequence 400a, and supplies it to the second adder sequence 400b.

In this manner, the ΔΣ modulator 20 included in the transmitter 1 can perform high-speed ΔΣ modulation.

A ΔΣ modulator 20 of the present invention having a minimum configuration will be described.

Figure 15:
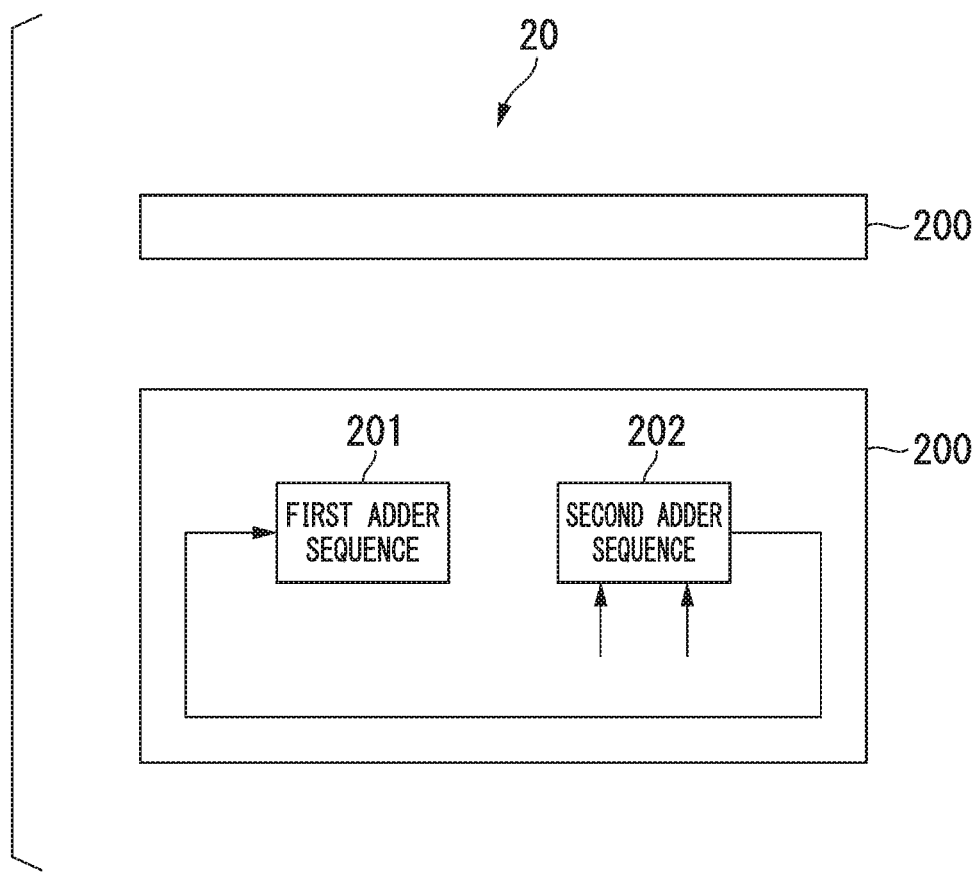
FIG. 15 is a diagram showing a configuration of a ΔΣ modulator having a minimum configuration according to the present invention.

As shown in FIG. 15, the ΔΣ modulator 20 of the present invention having a minimum configuration includes at least a plurality of integrators 200. The integrator 200 includes at least a first adder sequence 201 and a second adder sequence 202.

The first adder sequence 201 includes multiple adders that are respectively connected in series.

The second adder sequence 202 includes multiple adders that are respectively connected in series.

The second adder sequence 202 is an adder sequence that performs feedback of a logical calculation result of the second adder sequence 202 as an input to the first adder sequence 201.

The integrator 200 processes an input supplied in parallel to the multiple adders of the first adder sequence 201, and supplies it to the second adder sequence 202.

The ΔΣ modulator 20 including the TI accumulator 200 according to the exemplary embodiment of the present invention was described by way of examples, namely cases including two adder sequences respectively corresponding to a first-half input and a second-half input, and three adder sequences respectively corresponding to a first-half input, a middle stage input, and a second-half input. However, the ΔΣ modulator 20 including the TI accumulator 200 according to the exemplary embodiment of the present invention is in no way limited to this. For example, if the ΔΣ modulator 20 performs processing in which N adders input (2N) one-bit input signals and output N one-bit signals, it may be divided into L adders whose order is predetermined and L input signals whose order is predetermined and correspond to that adders, and include (L−1) multiple XOR units 501, and (L−1) XOR units 502. In this case, as described in the exemplary embodiment, the divided input signal is appropriately delayed using a delay circuit such as the D latch 600 such that L parallel processes are accurately performed at an appropriate timing at the Lth clock signal. At this time, the Rth multiple XOR unit 501 in the ΔΣ modulator 20 performs an exclusive OR logical operation using, among the N sets of input signals, the signal of the Rth set delayed by the amount of (R−1) clocks, and the signal of the output of the (R−1)th multiple XOR unit 501 delayed by the amount of one clock as inputs.

The exemplary embodiment of the present invention has been described. However the ΔΣ modulator 20 has a computer system in its interior. Further, the procedures of the processing described above are stored in a computer-readable recording medium in the form of a program, and the processing described above is performed by the computer reading and executing the program. Here, the computer-readable recording medium refers to a magnetic disk, a magneto-optical disk, a CD-ROM, a DVD-ROM, a semiconductor memory, or the like. Furthermore, the computer program may be delivered to a computer by means of a communication line, and the computer receiving the distribution may be made to execute the program.

Moreover, the program described above may be one for realizing a portion of the functionality mentioned above. Further, it may be one that realizes the functionality mentioned above by being combined with a program already stored on the computer system, as a so-called difference file (difference program).

While several exemplary embodiments of the present invention have been described, these exemplary embodiments have been presented by way of example and in no way limit the scope of the invention. Furthermore, various omissions, substitutions, and changes can be made without departing from the gist of the invention.

INDUSTRIAL APPLICABILITY

According to the ΔΣ modulator described above, it is possible to perform high-speed ΔΣ modulation.

REFERENCE SYMBOLS

1 Transmitter
10 Baseband signal generator
20 ΔΣ modulator
30 Class D power amplifier
40 Band pass filter 50 Antenna
100 (100a1 to 100a16), 200 (200a1 to 200a16) TI accumulator
300 (300a1 to 300aN) Full adder
500, 500a, 500b Input calculation unit
501, 501a, 501b Multiple XORs
502, 502a, 502b XOR
503, 503a1, 503a2, 503b, 600 (600a1 to 600aN, 600b, 600c1 to 600cN) D latch
201, 400a First adder sequence
202, 400b Second adder sequence

What is claimed is:

1. A ΔΣ modulator using multiple integrators, each of the integrators comprising:
a plurality of stages of adder sequences, each of the adder sequences comprising a plurality of adders connected in series,
wherein each of the integrators is configured to:
perform feedback of a result of a second adder sequence as an input to a first adder sequence, the first adder sequence being a first stage of the plurality of stages, and the second adder sequence being a last stage of the plurality of stages;
process inputs supplied to the plurality of adders of the first adder sequence; and
supply a processing result it to the second adder sequence,
wherein each of the integrators further comprises:
a parity calculation unit and an XOR calculation unit configured to process the inputs supplied to the plurality of adders of the first adder sequence and supply the processing result to the second adder sequence,
wherein the parity calculation unit is configured to perform a logical operation using portion of the inputs to the first adder sequence as an input, and
the XOR calculation unit is configured to parallelize calculation of adder sequence by performing a logical operation using an output value of the parity calculation unit and a feedback value from the second adder sequence as inputs, and inputting a result of the logical operation to the second adder sequence.

2. The ΔΣ modulator according to claim 1, wherein the total number of the plurality of adders of the first adder sequence and the plurality of adders of the second adder sequence is N, and N one-bit output signals are output when 2N one-bit signals are input.

3. The ΔΣ modulator according to claim 2, wherein the 2N one-bit signals are divided into N sets of two signals, and the N sets of two signals are input to the plurality of adders of the first adder sequence and the plurality of adders of the second adder sequence in a predetermined order.

4. The ΔΣ modulator according to claim 3, wherein the parity calculation unit is configured to receive, among the N sets of two signals, the first to Kth (K<N) sets of signals.

5. The ΔΣ modulator according to claim 2, wherein the XOR calculation unit is configured to perform a logical operation between a signal in which an output of the parity calculation unit has been delayed by one clock, and a sum bit of an Nth adder among the total of N adders of the plurality of adders of the first adder sequence and the plurality of adders of the second adder sequence.

6. The ΔΣ modulator according to claim 2, wherein a first adder among the total of N adders of the plurality of adders of the first adder sequence and the plurality of adders of the second adder sequence is configured to perform a logical operation between a signal in which a signal of a first set among the N sets of two signals has been delayed by one clock, and a signal in which a sum bit of an Nth adder among the total of N adders of the plurality of adders of the first adder sequence and the plurality of adders of the second adder sequence has been delayed by one clock.

7. The ΔΣ modulator according to claim 4, wherein a (K+1)th adder among the total of N adders of the plurality of adders of the first adder sequence and the plurality of adders of the second adder sequence is configured to perform a logical operation between a signal in which a signal of an (K+1)th set among the N sets of two signals has been delayed by one clock, and an output signal of the XOR calculation unit.

8. The ΔΣ modulator according to claim 2, wherein a Pth (where P excludes 2 to N, and K+1) adder among the total of N adders of the plurality of adders of the first adder sequence and the plurality of adders of the second adder sequence is configured to perform a logical operation between a signal in which a signal of a Pth set among the N sets of two signals has been delayed by one clock, and a signal in which a sum bit of a (P−1)th adder among the total of N adders of the plurality of adders of the first adder sequence and the plurality of adders of the second adder sequence has been delayed by one clock.

9. The ΔΣ modulator according to claim 2, each of the integrators further comprising:
N delay circuits that respectively correspond to the total of N adders of the plurality of adders of the first adder sequence and the plurality of adders of the second adder sequence,
wherein each of the total of N adders of the plurality of adders of the first adder sequence and the plurality of adders of the second adder sequence is configured to generate a carry bit which is logically operated by itself, and
each of the delay circuits is configured to generate a signal in which the carry bit generated by the corresponding one among the N adders of the plurality of adders of the first adder sequence and the plurality of adders of the second adder sequence has been delayed by one clock.

10. The ΔΣ modulator according to claim 2, wherein the XOR calculation unit is configured to perform a logical operation between an output of the parity calculation unit, and a sum bit of an Nth adder among the total of N adders of the plurality of adders of the first adder sequence and the plurality of adders of the second adder sequence, and generate a signal in which a result of the logical operation has been delayed by one clock.

11. A transmitter comprising the ΔΣ modulator according to claim 1.

12. An integrator comprising:
a plurality of stages of adder sequences, each of the adder sequences comprising a plurality of adders connected in series,
wherein the integrator is configured to:
perform feedback of a result of a second adder sequence as an input to a first adder sequence, the first adder sequence being a first stage of the plurality of stages, and the second adder sequence being a last stage of the plurality of stages;
process inputs supplied to the plurality of adders of the first adder sequence; and
supply a processing result to the second adder sequence,
wherein the integrator comprises:
a parity calculation unit and an XOR calculation unit configured to process the inputs supplied to the plurality of adders of the first adder sequence and supply the processing result to the second adder sequence,
wherein the parity calculation unit is configured to perform a logical operation using a portion of the inputs to the first adder sequence as an input, and
the XOR calculation unit is configured to parallelize calculation of adder sequences by performing a logical operation using an output value of the parity calculation unit and a feedback value from the second adder sequence as inputs, and inputting a result of the logical operation to the second adder sequence.

* * * * *